(12) United States Patent
Hotta et al.

(10) Patent No.: US 8,089,321 B2
(45) Date of Patent: Jan. 3, 2012

(54) FLUCTUATION OSCILLATOR, FLUCTUATION OSCILLATING SYSTEM, OBSERVATION DEVICE AND CONTROL SYSTEM

(75) Inventors: Yasushi Hotta, Suita (JP); Teruo Kanki, Suita (JP); Naoki Asakawa, Suita (JP); Toshio Kawahara, Suita (JP); Tomoji Kawai, Suita (JP); Hitoshi Tabata, Tokyo (JP)

(73) Assignee: Osaka University (JP)

( * ) Notice: Subject to any disclaimer, the term of this patent is extended or adjusted under 35 U.S.C. 154(b) by 46 days.

(21) Appl. No.: 12/673,797

(22) PCT Filed: Aug. 21, 2008

(86) PCT No.: PCT/JP2008/064932
§ 371 (c)(1),
(2), (4) Date: Feb. 17, 2010

(87) PCT Pub. No.: WO2009/025327
PCT Pub. Date: Feb. 26, 2009

(65) Prior Publication Data
US 2011/0068875 A1     Mar. 24, 2011

(30) Foreign Application Priority Data
Aug. 22, 2007   (JP) .................................. 2007-215457

(51) Int. Cl.
*H03B 29/00*     (2006.01)
*H03K 3/03*      (2006.01)
*G06N 3/04*      (2006.01)

(52) U.S. Cl. ............... 331/78; 331/57; 331/172; 706/33

(58) Field of Classification Search ............... 331/78, 331/57, 172, 173, 55; 706/1, 2, 15, 26, 27, 706/29, 33, 44
See application file for complete search history.

(56) References Cited

U.S. PATENT DOCUMENTS 4,169,249 A *   9/1979   Hoffmann et al. .............. 331/78
7,449,967 B2 * 11/2008   Ueda ................................ 331/78

FOREIGN PATENT DOCUMENTS

JP    4-10807     1/1992
JP    6-112785    4/1994

OTHER PUBLICATIONS

Hotta et al, "Cooperative Dynamics of an Artificial Stochastic Resonant System", Applied Physics Express, Aug. 8, 2008, pp. 088002-1-088002-3.*

Ijspeert, et al., "From Swimming to Walking with a Salamander Robot Driven by a Spinal Cord Model", Science, vol. 315, Mar. 9, 2007, pp. 1416-1420.

* cited by examiner

*Primary Examiner* — Ryan Johnson
(74) *Attorney, Agent, or Firm* — Gerald E. Hespos; Michael J. Porco

(57) ABSTRACT

Four stochastic resonators 20-1 to 20-4 outputting a pulse signal in accordance with a stochastic resonance phenomenon are unidirectionally coupled in a ring-like form to constitute a fluctuation oscillator 10. When a signal output from each of the stochastic resonators 20-1 to 20-4 is successively transmitted in the stochastic resonators 20-1 to 20-4 coupled in a ring-like form, the output timings at each stochastic resonator 20 are synchronized with each other due to a cooperation phenomenon between the stochastic resonators 20-1 to 20-4, so that each stochastic resonator 20 is self-excited to oscillate at a constant period of time.

11 Claims, 24 Drawing Sheets

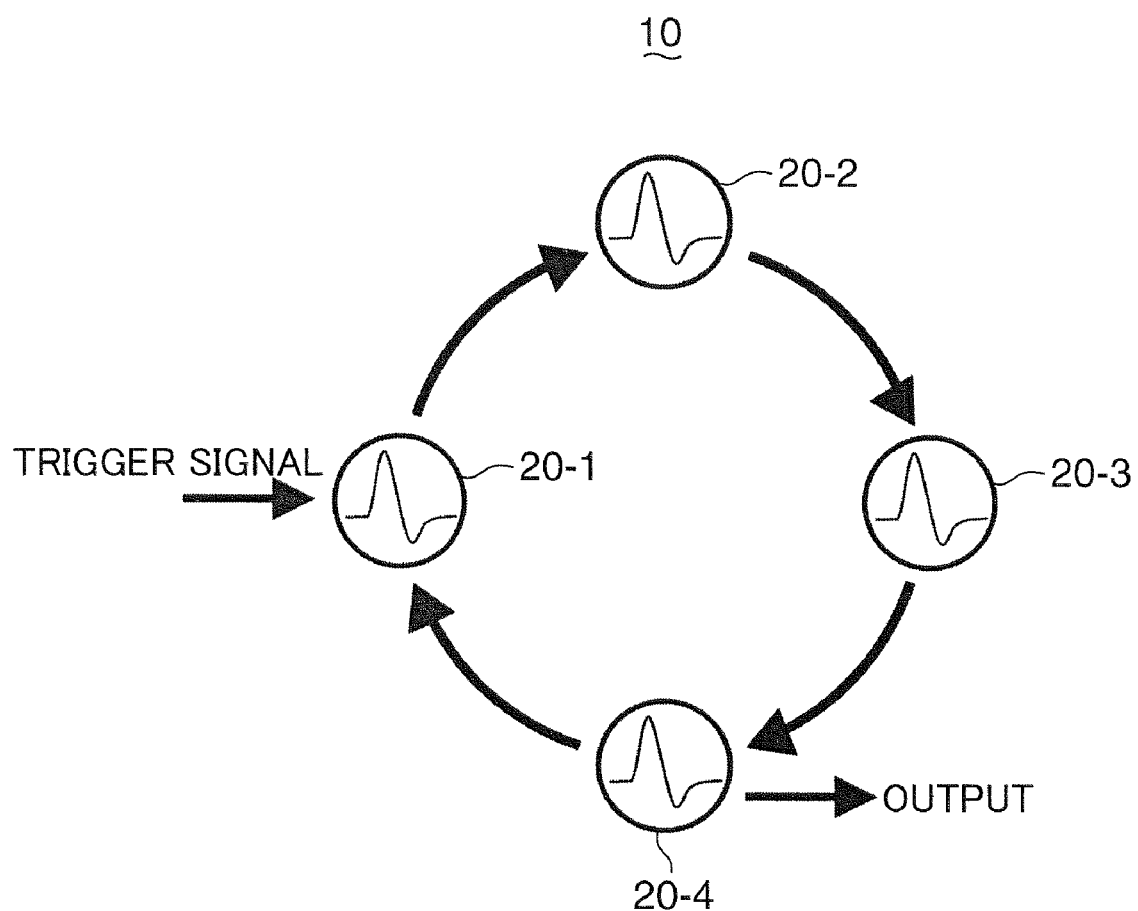

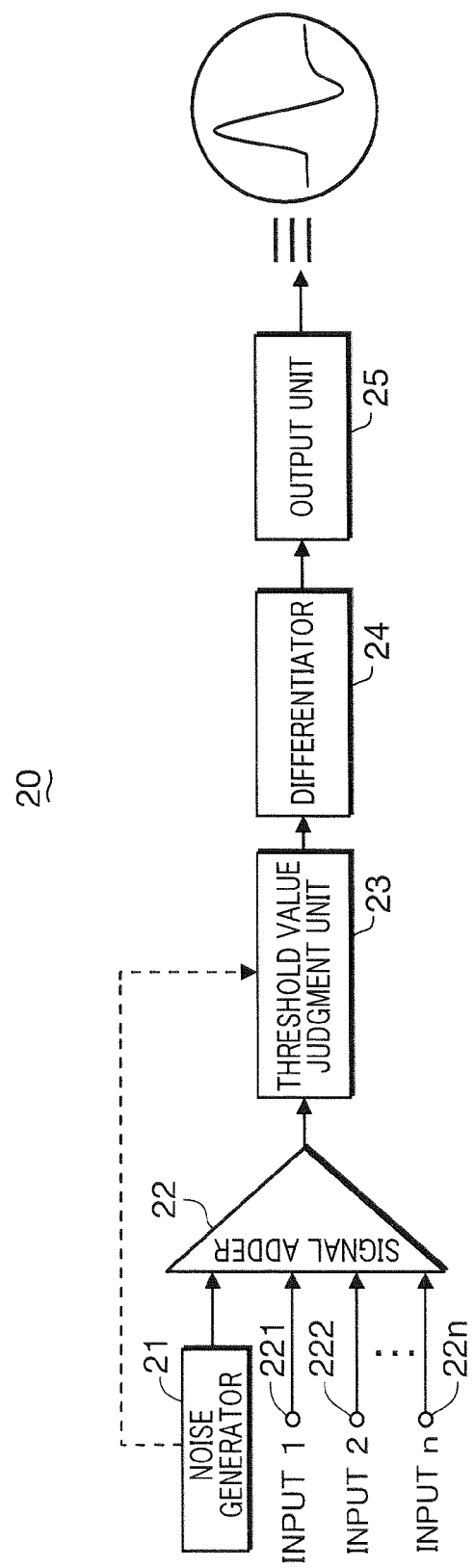

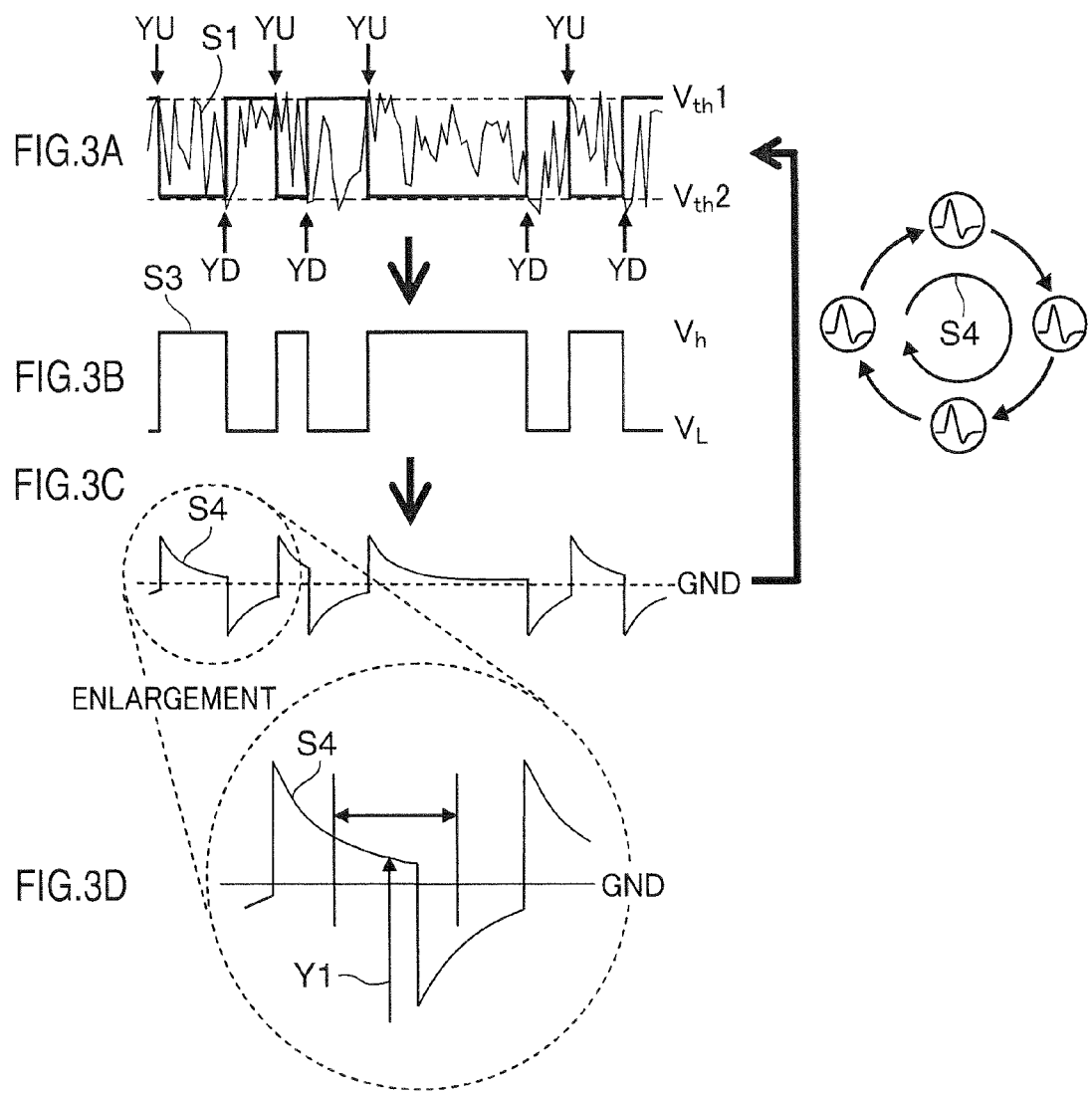

FIG.11

| trigger $v_{in}$ | noise $\eta$ | threshold $\theta$ | response $\alpha$ | coupling $w_i$ | internal circuit | |
|---|---|---|---|---|---|---|
| | | | | | C | R |
| 0 | 1.5 | 1 or −1 | 3M | 2.5 | 10u | 100k |

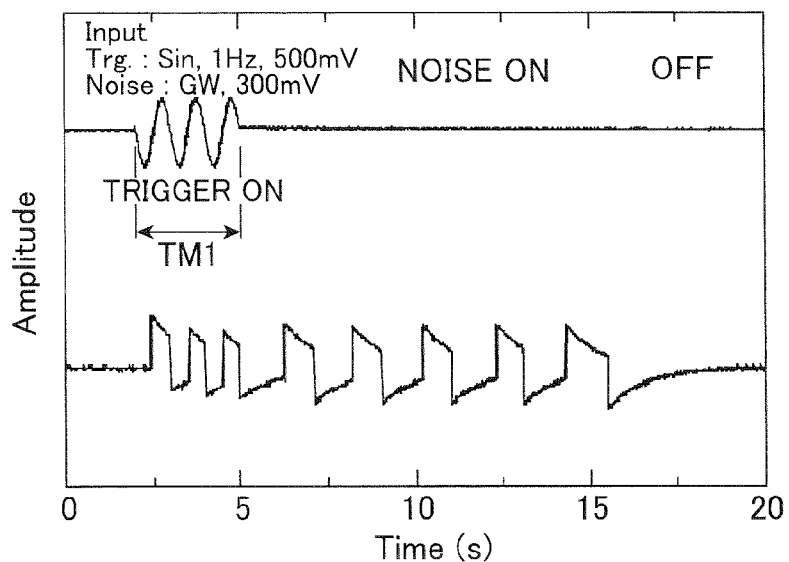
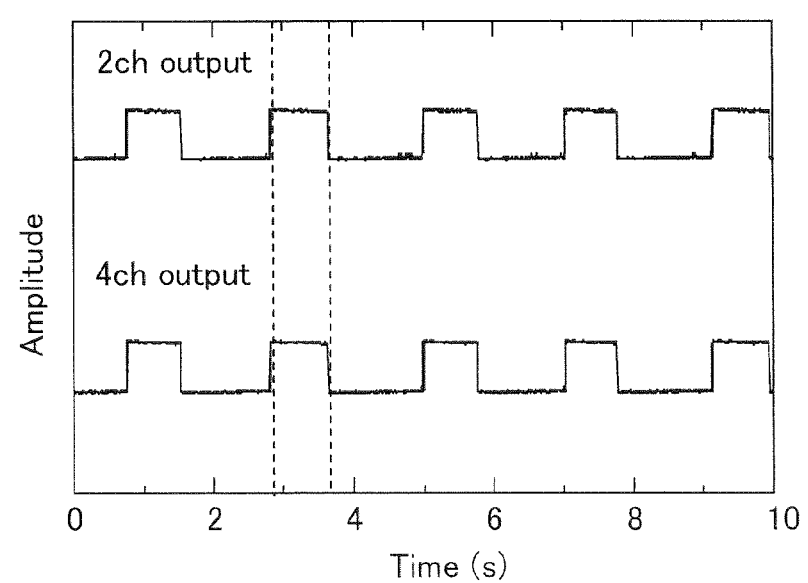

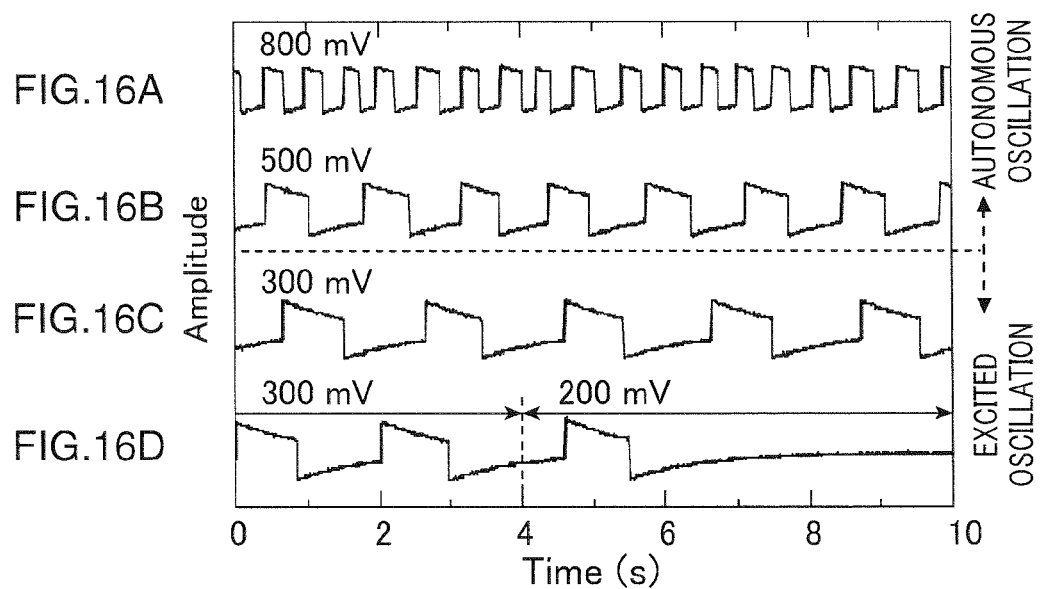
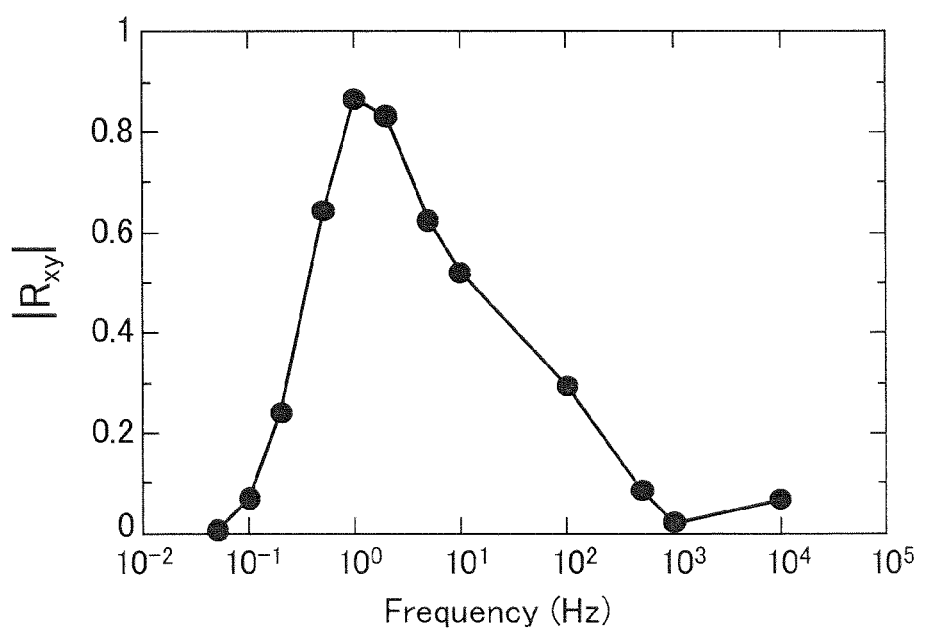

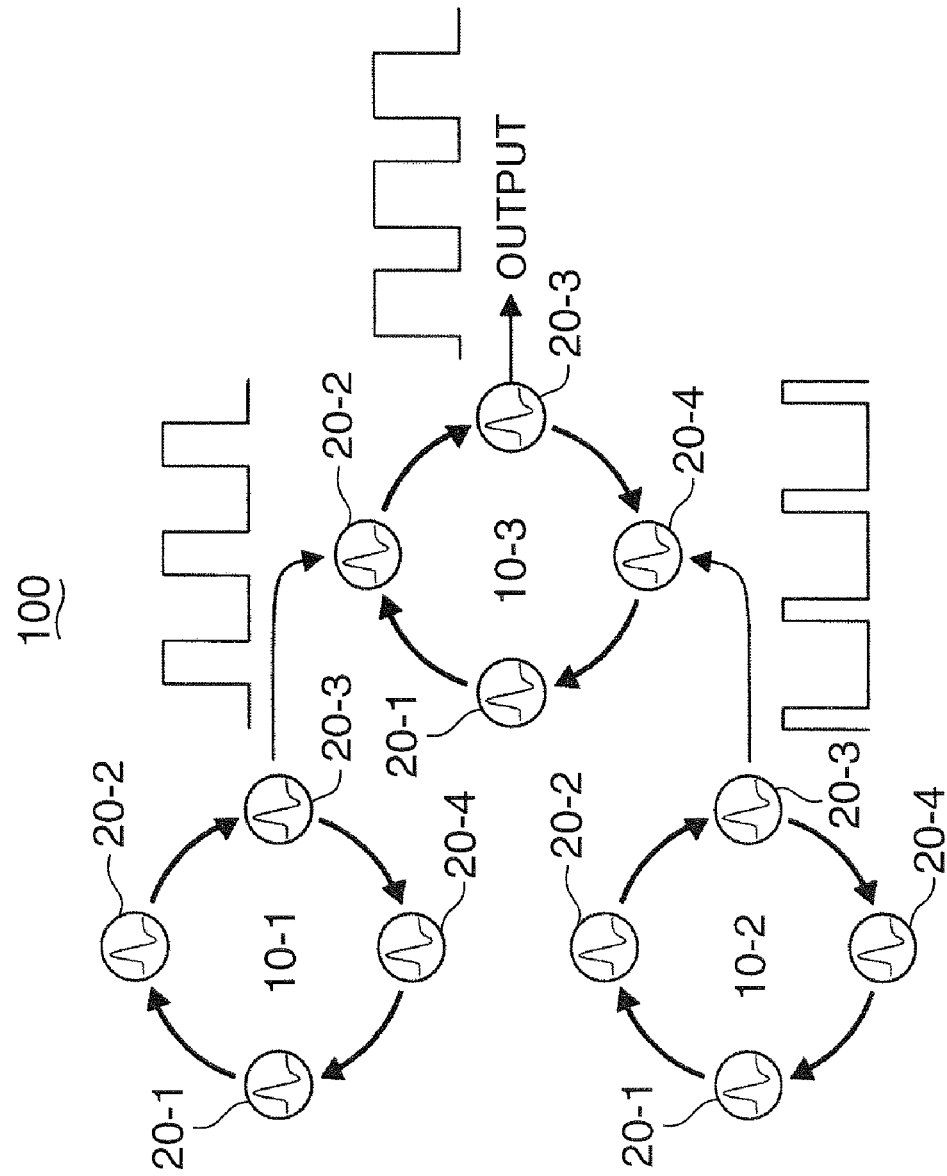

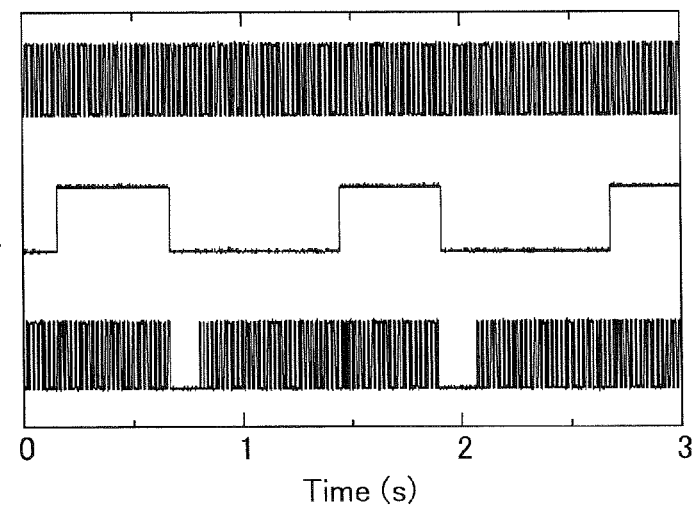
FIG.21A
FIG.21B
FIG.21C
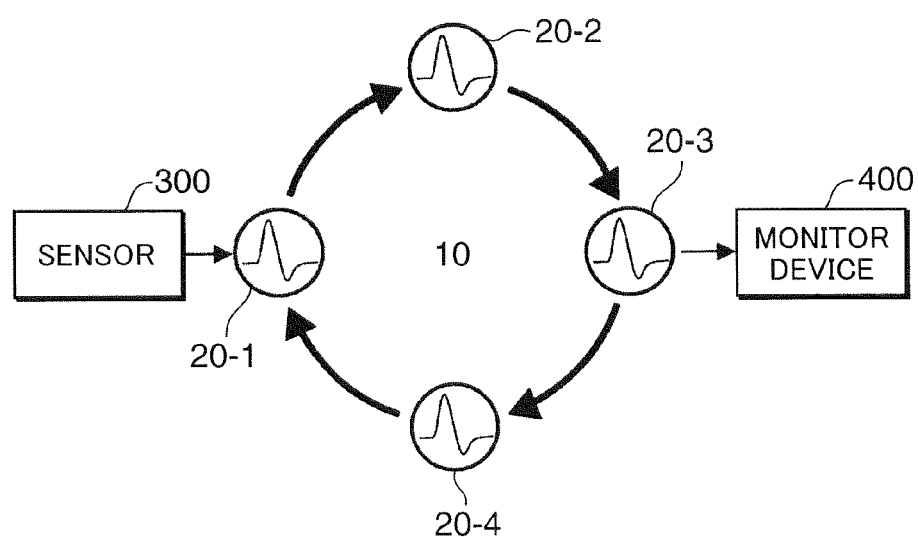
FIG.22

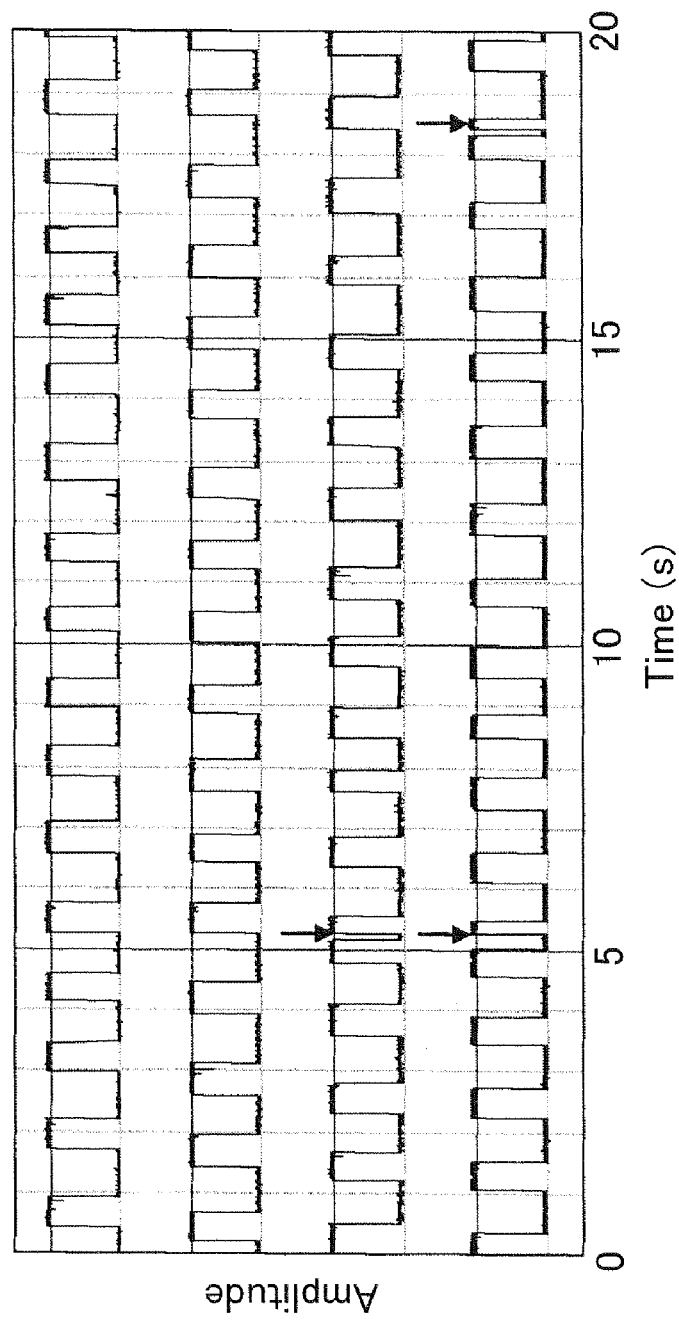

US 8,089,321 B2

FLUCTUATION OSCILLATOR, FLUCTUATION OSCILLATING SYSTEM, OBSERVATION DEVICE AND CONTROL SYSTEM

BACKGROUND OF THE INVENTION

1. Field of the Invention

The present invention relates to a fluctuation oscillator, a fluctuation oscillating system, an observation device and a control system.

2. Description of the Related Art

In recent years, various research has been carried out into artificially creating a central pattern generator (CPG) and using this CPG to operate actuators so as to control an object. Here, a CPG is an oscillator based on a neural network which autonomously outputs a periodic signal to the musculoskeletal system which controls the activities of walking, respiratory and circulatory organs, and the like, in a living organism. Known methods of artificially creating a CPG are a method which creates a CPG signal by computer simulation, and a method which joins together conventional oscillators, such as liquid crystal oscillators, Hartley oscillators, Clapp oscillators, astable multivibrators, in a plurality of chains, and the like. For example, SCIENCE 315, 1416 (2007) describes technology for artificially creating a CPG by linking together a plurality of conventional oscillators in a chain, and using signals output from this CPG to control a robot having a multiple degree-of-freedom joint.

However, in order to create a CPG artificially by computer simulation, it is necessary to use a computer with high computing capacity, and there has been a problem in that compactification of the apparatus and reduction of power consumption are difficult to achieve. Furthermore, in the method described in Non-Patent Document 1, a conventional oscillator is instable in respect of noise, and moreover, the drive voltage of the semiconductor elements must be set to a high level in order to combat noise, thus making it difficult to achieve a CPG with low power consumption. Moreover, in a conventional oscillator, the oscillation frequency is fixed by the circuit constant, and since the oscillation frequency cannot be changed flexibly and autonomously, then there has been a problem in that such an oscillator is not suitable as a CPG which is required to perform cooperative operation between oscillators.

SUMMARY OF THE INVENTION

The object of the present invention is to resolve the problems described above.

More specifically, the object of the present invention is to provide a fluctuation oscillator and a fluctuation oscillating system which has low power consumption, which is robust in respect of noise signals, and which can change the oscillation frequency flexibly and autonomously, and an observation device and control system using same.

Furthermore, the object of the present invention is to provide a fluctuation oscillator and a fluctuation oscillating system, and an observation device and control system using same, which are useful in creating a CPG artificially.

The fluctuation oscillator according to one aspect fluctuation oscillator the present invention comprises a plurality of stochastic resonators which apply fluctuation to an input signal by superimposing a noise signal thereon, compare the resulting signal with a threshold value, and then perform differentiation to output a pulse signal, the plurality of stochastic resonators being coupled unidirectionally in a ring-like form in such a manner that an output terminal of one stochastic resonator is connected to an input terminal of the stochastic resonator of the following stage, and an input terminal of the one stochastic resonator is connected to an output terminal of the stochastic resonator of the preceding stage.

The fluctuation oscillating system according to a further aspect of the present invention comprises a first and a second fluctuation oscillator, each being constituted by a fluctuation oscillator as described above, and the input terminal of one stochastic resonator constituting the first fluctuation oscillator being connected to the output terminal of one stochastic resonator constituting the second fluctuation oscillator.

The observation device and control system according to a further aspect of the present invention use the fluctuation oscillator described above.

BRIEF DESCRIPTION OF THE DRAWINGS

FIG. 1 shows a general schematic view of a fluctuation oscillator according to an embodiment of the present invention.

FIG. 2 is a diagram showing the composition of a stochastic resonator shown in FIG. 1.

FIGS. 3A to 3D are illustrative diagrams of the operational principle of a fluctuation oscillator.

FIG. 11 is a table showing the values of various parameters in Equation (9).

FIGS. 14A and 14B show waveform diagrams of the fluctuation oscillator shown in FIG. 1.

FIGS. 15A and 15B show waveform diagrams of the signal output from the stochastic resonator in the fluctuation oscillator shown in FIG. 1.

FIGS. 16A to 16D are waveform diagrams showing a signal output when the intensity of the noise signal is changed in the fluctuation oscillator shown in FIG. 1.

FIG. 17 is a graph showing the frequency dependence of the input/output cross-correlation function of the fluctuation oscillator shown in FIG. 1.

FIG. 20 is a diagram showing the composition of a fluctuation oscillating system.

FIGS. 21A to 21C show waveform diagrams of a signal output from a fluctuation oscillating system.

FIG. 22 is a diagram showing the composition of an observation device.

FIGS. 28A to 28D are waveform diagrams of an output signal from a threshold value judgment unit of a stochastic resonator constituting a fluctuation oscillator.

DETAILED DESCRIPTION OF THE PREFERRED EMBODIMENTS

Figure 4A:
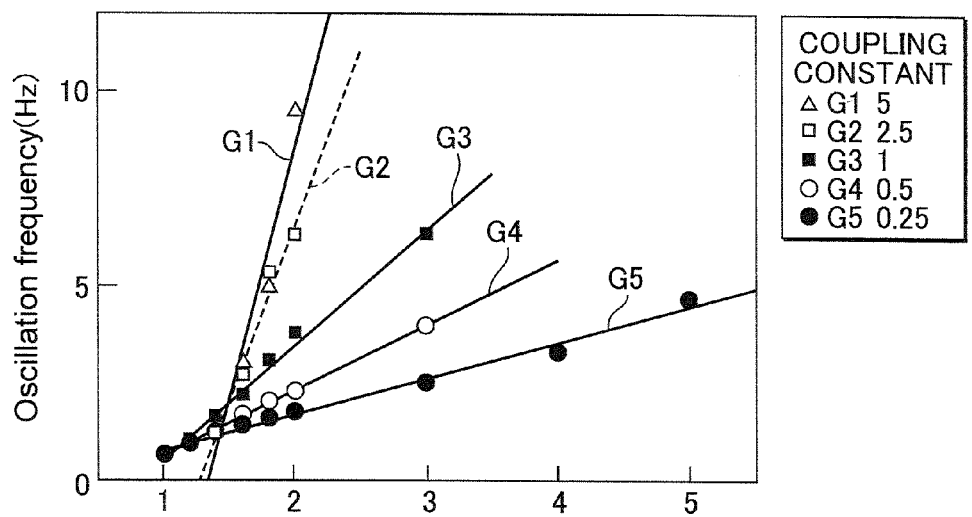
FIGS. 4A and 4B are graphs showing the coupling constant.

Below, a fluctuation oscillator according to an embodiment of the present invention will be described. FIG. 1 shows a general schematic drawing of a fluctuation oscillator 10 according to an embodiment of the present invention. The present fluctuation oscillator 10 comprises four stochastic resonators 20-1 to 20-4 which are coupled unidirectionally in a ring-like form. Where a certain stochastic resonator is not specified in particular, reference is made simply to stochastic resonator(s) 20. Furthermore, the number of stochastic resonators 20 is not limited to four, and may be two, three or five or more.

Here, unidirectional coupling means that the signals flow in one direction. In the case of FIG. 1, the stochastic resonators 20 are connected in a ring-like form by means of the output terminal of one stochastic resonator being connected to the input terminal of another adjacent stochastic resonator 20 and the input terminal of one stochastic resonator 20 being connected to the output terminal of another adjacent stochastic resonator, in such a manner that the output terminal of the stochastic resonator 20-1 is connected to the input terminal of the stochastic resonator 20-2, and the input terminal of the stochastic resonator 20-1 is connected to the output terminal of the stochastic resonator 20-4. Consequently, the signal flowing in the fluctuation oscillator 10 circulates successively through the stochastic resonator 20-1 to 20-4.

FIG. 2 is a diagram showing the composition of a stochastic resonator 20 shown in FIG. 1. As shown in FIG. 2, the stochastic resonator 20 comprises a noise generator 21, a signal adder 22, a threshold value judgment unit 23, a differentiator 24 and an output unit 25. The noise generator 21 is, for example, constituted by a function generator which generates various noise signals, such as Gaussian white noise, thermal noise, or the like.

The signal adder 22 inputs n types of input signal (where n is a positive integer) and a noise signal output from the noise generator 21, multiplexes (adds) the input noise signal and n types of input signals, applies a fluctuation to this input signal, and output same to the threshold value judgment unit 23. Here, the n types of input signals are input via the input terminals 221 to 22n.

In this fluctuation oscillator 10, a trigger signal forming an oscillator trigger, for example, is input to the input terminal 221, and an output signal from the stochastic resonator 20 connected in the prior stage (the upstream side in the signal path) is input to the input terminal 222. This is one example and the trigger signal and the signal output from another stochastic resonator 20 may also be input to another input terminal.

The threshold value judgment unit 23 compares the signal to which fluctuation has been applied by the signal adder 22 with a prescribed threshold value, and outputs a pulse signal which has a high level when this signal is equal to or greater than the threshold value, and outputs a pulse signal which has a low level when this signal is smaller than the threshold value. Here, the threshold value has hysteresis and therefore the threshold value when the pulse signal changes from low level to high level and the threshold value when the pulse signal changes from high level to low level are different. Hysteresis can be imparted readily to the threshold value by composing the threshold value judgment unit 23 from a Schmitt trigger circuit, for example.

The differentiator 24 differentiates the signal output from the threshold value judgment unit 23. The output unit 25 adjusts the level of the signal output from the differentiator 24. In the present embodiment, the stochastic resonator 20 shown on the left-hand side in FIG. 2 is expressed by using the symbols on the right-hand side in FIG. 2. Furthermore, the noise signal intensity, the time constant of the differentiator 24, and the coupling constant have the same values in each of the respective stochastic resonators 20, and are set to values previously established in such a manner that the fluctuation oscillator 10 is able to oscillate.

FIGS. 3A to 3D are illustrative diagrams of the operating principles of the fluctuation oscillator 10; FIG. 3A shows the signal S1 to which noise output from the signal adder 22 has been added, and the variation in the threshold values Vth1, Vth2 (Vth1>Vth2) of the threshold value judgment unit 23. FIG. 3B shows a signal S3 output from the threshold value judgment unit 23. FIG. 3C shows a signal S4 output from the differentiator 24. FIG. 3D is an enlarged diagram of the signal S4.

The signal S1 exceeds the threshold value Vth1 in the portion indicated by arrow YU in FIG. 3A. If the signal S1 exceeds the threshold value Vth1, then the signal S3 is switched from low level (VL) to high level (VH). By this means, the stochastic resonator 20 switches on. Furthermore, the signal S1 is lower than the threshold value Vth2 in the portion indicated by the arrow YD in FIG. 3A. When the signal S1 is lower than the threshold value Vth2, then the signal S3 switches from high level (VH) to low level (VL). By this means, the stochastic resonator 20 switches off.

The signal S3 is differentiated by the differentiator 24 and output as signal S4. In this case, the signal S4 is attenuated to a ground level by the time constant of the differentiator 24 and is input to the stochastic resonator 20 connected in the next stage.

In this way, the signal S4 is circulated recursively in the fluctuation oscillator 10. The recursively circulated signal S4 is attenuated over time, by the action of the differentiators 24 of the respective stochastic resonators 20 of the fluctuation oscillator 10. If the time since the switching on of the stochastic resonator 20 is short, then the intensity of the signal S4 is strong. If the intensity of signal S4 is strong, then the respective stochastic resonators 20 connected in a ring-like form are all in an on state.

For example, if a certain stochastic resonator 20 is switched on, a signal S4 having a peak in the positive direction is output from the stochastic resonator 20. Consequently, the signals S3 of the other stochastic resonators 20 which are connected in a ring-like form assume a high level and signals S4 having virtually simultaneous peaks in the positive direction are output from all of the stochastic resonators 20.

When a certain time has elapsed since the switching on of the stochastic resonators 20, the attenuation of the signal S4 progresses and the intensity of the signal S4 becomes weak. As the signal S4 is attenuated, there is an increased probability that any one of the stochastic resonators 20 which are connected in a ring-like form will switch to an off state.

For example, up until the intensity of the signal S4 reaches the point indicated by arrow Y1 as shown in FIG. 3D, all of the stochastic resonators 20 are on, but when the intensity of the signal S4 has become weaker than the intensity of the arrow Y1, there is an increased probability that any one of the stochastic resonators 20 will switch off.

If one of the stochastic resonators 20 switches off, then a signal S4 having a peak in the negative direction is output from the stochastic resonator 20. In accordance with this, the other stochastic resonators 20 switch off and signals S4 having virtually simultaneous peaks in the negative direction are output from all of the stochastic resonators 20. The fluctuation oscillator 10 oscillates due to the respective stochastic resonators 20 repeatedly switching between an on state and an off state as described above.

The signal S1 is a signal having randomness to which fluctuation has been applied by the noise signal. Therefore, the time interval from switching on until switching off is determined stochastically and hence is not exactly uniform in each of the stochastic resonators 20. However, the greater the intensity of the signal S1, the greater the probability of a stochastic resonator 20 switching off, and therefore this time interval becomes shorter, the greater the intensity of the signal S1. In other words, if the intensity of the noise signal is adjusted to a suitable value, then in overall terms, the time interval becomes more dependent on the intensity of the signal S1 rather than the randomness of the signal S1. Therefore, the fluctuation oscillator 10 oscillates at a frequency corresponding to the intensity of the signal S1. Furthermore, since the time interval until switching off is dependent on the intensity of the input signal, which includes the intensity of the noise signal, then if the intensity of the input signal changes, the fluctuation oscillator 10 is self-excited to oscillate at a corresponding frequency. Moreover, as the time constant of the differentiator 24 becomes longer, so the time interval from the stochastic resonators 20 switching on until switching off becomes longer, and the frequency of the output signal from the fluctuation oscillator 10 becomes longer. Consequently, by adjusting the time constant of the stochastic resonators 20 to a suitable value, it is possible to adjust the frequency of the output signal from the fluctuation oscillator 10 to a desired frequency value.

Figure 4B:
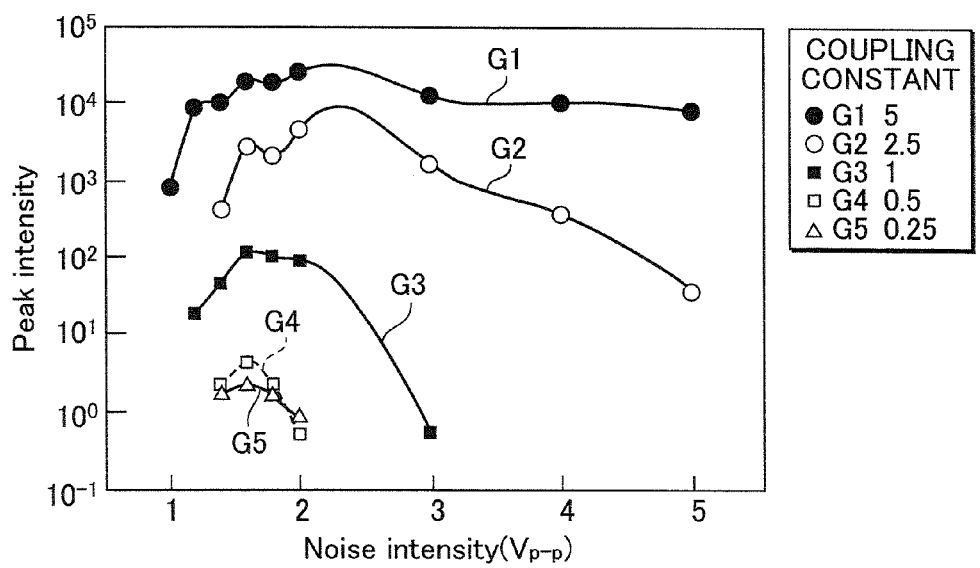

FIGS. 4A and 4B are graphs showing the coupling constant, in which FIG. 4A is a graph showing the oscillation frequency of the output signal from the fluctuation oscillator 10, and FIG. 4B is a graph showing the peak power spectrum intensity of the output signal from the fluctuation oscillator 10. In FIG. 4A, the vertical axis represents the oscillation frequency and the horizontal axis represents the intensity of the noise signal. In FIG. 4B, the vertical axis represents the peak of the power spectrum intensity of the output signal from the fluctuation oscillator 10, and the horizontal axis represents the intensity of the noise signal. Here, the coupling constant indicates the extent to which one stochastic resonator is able to transmit a signal to an adjacent stochastic resonator, and a more concrete description is provided hereinafter.

As shown in FIG. 4A, it can be seen that as the coupling constant becomes higher, the gradient of the graph increases and the oscillation frequency becomes higher. Furthermore, it can be seen that if the coupling constant is uniform, as indicated by the respective curves in FIG. 4A, the frequency of the output signal becomes greater as the intensity of the noise signal increases.

Furthermore, as shown in FIG. 4B, it can be seen that as the coupling constant increases, the peak of the power spectrum intensity of the output signal from the fluctuation oscillator 10 increases. Moreover, it can also be seen that, in the respective curves in FIG. 4B, the peak power spectrum intensity of the output signal changes by tracing an upwardly convex curve with respect to the intensity of the noise signal, and if the intensity of the noise signal becomes excessively low or excessively high, then the power spectrum intensity of the output signal becomes weak.

In the description of FIG. 3, the threshold value judgment unit 23 is taken to output a signal of high level if the signal S1 exceeds the threshold value Vth1 and to output a signal of low level if the signal S1 is lower than the threshold value Vth2, but the composition is not limited to this and the threshold value judgment unit 23 may also output a signal of low level if the signal S1 exceeds the threshold value Vth1 and output a signal of high level if the signal S1 is lower than threshold value Vth2.

Figure 5:
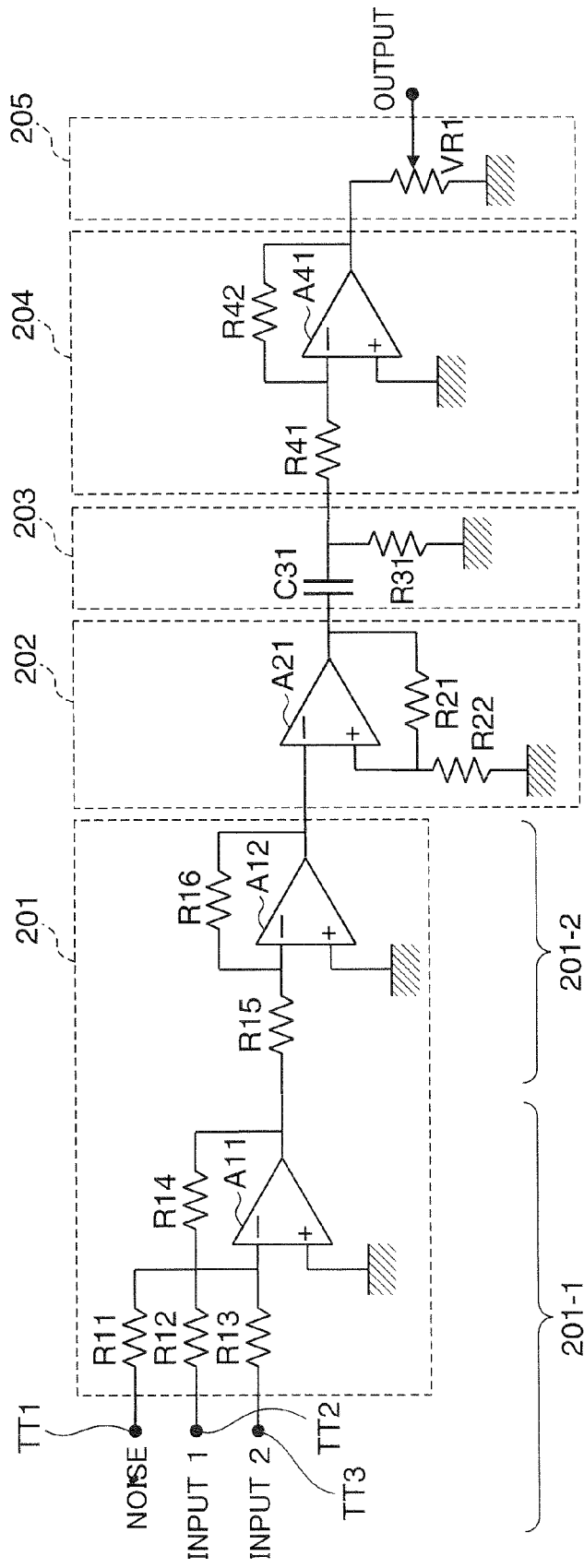
FIG. 5 shows a circuit diagram of the stochastic resonator shown in FIG. 2.

FIG. 5 shows a circuit diagram of a stochastic resonator 20 shown in FIG. 2. As shown in FIG. 5, the stochastic resonator 20 comprises a mixer circuit 201 which corresponds to the signal adder 22 in FIG. 2, a comparator 202 which corresponds to the threshold value judgment unit in FIG. 2, a differentiation circuit 203 which corresponds to the differentiator 24 in FIG. 2, and an inverse amplification circuit 204 and output adjustment circuit 205 which correspond to the output unit 25 in FIG. 2.

The mixer circuit 201 comprises an adder circuit 201-1 and an inverting amplifier circuit 201-2. The adder circuit 201-1 adds together a noise signal input to the input terminal TT1 which corresponds to the input terminal 221 in FIG. 2, an output signal from the stochastic resonator 20 which is connected in the previous stage and is input to the input terminal TT2 corresponding to the input terminal 222, and a trigger signal which is input to the input terminal TT3. The inverting amplifier circuit 201-2 amplifies the signal added by the adding circuit 201-1.

The adder circuit 201-1 comprises an operational amplifier A11. The negative terminal of the operational amplifier A11 is connected to the input terminals TT1 to TT3 via the resistances R11 to R13. The positive terminal of the operational amplifier A11 is grounded. The operational amplifier A11 is connected between the output terminal and the negative terminal via the resistance R14, thereby forming a negative feedback loop.

The inverting amplifier circuit 201-2 comprises an operational amplifier A12. The negative terminal of the operational amplifier A12 is connected to the output terminal of the operational amplifier A11 via a resistance R15. The positive terminal of the operational amplifier A12 is grounded. The output terminal of the operational amplifier A12 and the negative terminal are connected via a resistance R16, thereby creating a negative feedback loop.

The comparator 202 is constituted by a Schmitt trigger circuit comprising an operational amplifier A21. The positive terminal of the operational amplifier A21 is grounded via a resistance R22. The output terminal and the positive terminal of the operational amplifier A21 are connected via a resistance R21, thereby forming a positive feedback loop.

The differentiation circuit 203 comprises a capacitor C31 which is connected between the output terminal of the operational amplifier A21 and the inverting amplifier circuit 204, and a resistance R31, one end of which is connected to the capacitor C31 and the other end of which is grounded.

The inverting amplifier circuit 204 comprises an operational amplifier A41 and inverts the polarity of the signal output from the differentiation circuit 203. The negative terminal of the operational amplifier A41 is connected to the capacitor C31 via a resistance R41. The positive terminal of the operational amplifier A41 is grounded. The output terminal and the negative terminal of the operational amplification A41 are connected via a resistance R42. The inverting amplifier circuit 204 returns the polarity of the signal which has been inverted by the comparator 202, to its original polarity.

The output adjustment circuit 205 comprises a variable resistance VR1. The variable resistance VR1 adjusts the level of the signal output from the inverting amplifier circuit 204, by adjusting the resistance value, and thereby determines the coupling constant between the stochastic resonators 20.

The coupling constant is defined as "the peak intensity of the output signal from the stochastic resonator 20 connected in the previous stage divided by the threshold value of the threshold value judgment unit 23 when the stochastic resonator 20 switches on. In FIG. 3, this is the positive-direction peak of the signal S1 divided by the threshold value Vth1".

The fluctuation oscillator 10 shown in FIG. 1 which has the composition described above operates as described below. For example, when a trigger signal is input to the stochastic resonator 20-1, the stochastic resonator 20-1 switches on and outputs a signal S4 having a sudden peak. Consequently, the stochastic resonator 20-2 which is connected on the downstream side switches on.

In this way, if the signal S4 having a sudden peak is transmitted successively to the stochastic resonators 20-1 to 20-4 which are coupled in a ring-like form, then due to a cooperation phenomenon between the stochastic resonators 20, the signal output timings at each stochastic resonator 20 are synchronized and each of the stochastic resonators 20 is self-excited to oscillate at a constant time period. In other words, due to the fluctuation in the timings at which the stochastic resonators 20 switch on, each of the stochastic resonators 20 oscillates by autonomously selecting a readily synchronizable timing. Accordingly, it is possible to generate a periodic signal based on a similar principle to a CPG, which is an oscillator based on a neural network that outputs a periodic signal autonomously and which is constituted by neurons which fire on the basis of a stochastic resonance phenomenon, and it is possible to provide an oscillator which is useful in artificially creating a CPG.

Next, a stochastic resonance phenomenon is described. Stochastic resonance phenomenon is a phenomenon whereby a synthesized signal is generated by synthesizing a noise signal with a weak sub-threshold signal, and when this synthesized signal is processed against the threshold value, the weak signal is transmitted to the output side. In this case, the SN ratio (intensity of output signal/intensity of noise signal) is used to express the extent to which the signal is transmitted. The intensity of the weak signal is uniform, and if the intensity of the noise signal is weak, then the probability of the synthesized signal exceeding the threshold value is small, and the SN ratio becomes small.

On the other hand, if the intensity of the noise signal is strong, then the overall intensity of the synthesized signal is strengthened randomly, the frequency with which the portion of strong intensity in the weak signal exceeds the threshold value increases, and the frequency with which the portion of weak intensity in the weak signal exceeds the threshold value decreases. As a result of this, the information of the weak signal is transmitted to the output side as the frequency with which the synthesized signal exceeds the threshold value. Therefore, if the intensity of the noise signal becomes strong, then the SN ratio increases. This SN ratio becomes a maximum when the noise signal has a certain intensity. Furthermore, if the intensity of the noise signal becomes yet stronger, then the noise signal becomes dominant in the synthesized signal and starts to exceed the threshold value randomly, and the SN ratio declines.

Figure 6:
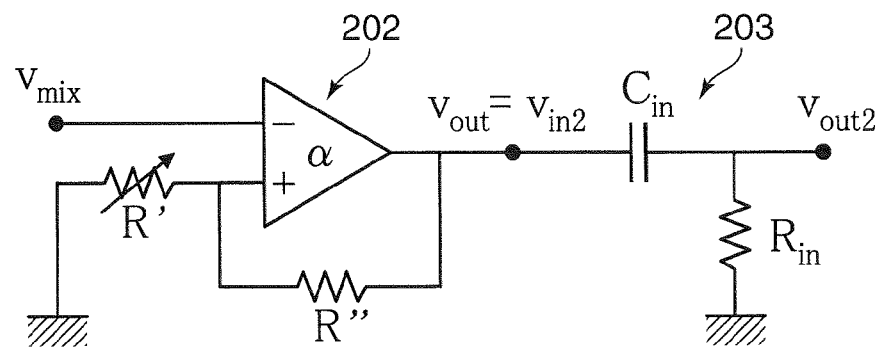
FIG. 6 is a diagram showing the comparator and differentiation circuit shown in FIG. 4.

Next, the operational principles of the stochastic resonators 20 will be described. FIG. 6 is a diagram showing the comparator 202 and the differentiation circuit 203 in FIG. 5. The values R', R", $C_{in}$, $R_{in}$ shown in FIG. 6 correspond respectively to R22, R21, C31 and R31 shown in FIG. 5.

The signal $v_{in}$ input to the stochastic resonator 20 is added to the noise signal η, and is input to the $v_{mix}$ terminal in FIG. 6. Here, the signal $v_{mix}$ input to the $v_{mix}$ terminal is expressed by Equation (1).

$$v_{mix}(t)=w \cdot v_{in}(t)+\eta(t) \tag{1}$$

where w is a weighting coefficient.

The differentiation equation of the stochastic resonators 20 is expressed by Equation (2).

$$dv(t)/dt=f\{v_{mix}(t)-\theta,\alpha\} \tag{2}$$

θ: threshold value; α: response speed of operational amplifier

The function f{ } in Equation (2) is given by the Sigmoid function indicated in Equation (3).

$$f\{v(t)-\theta,\alpha\}=\tan h[\alpha\{v(t)-\theta\}] \tag{3}$$

Figure 7:
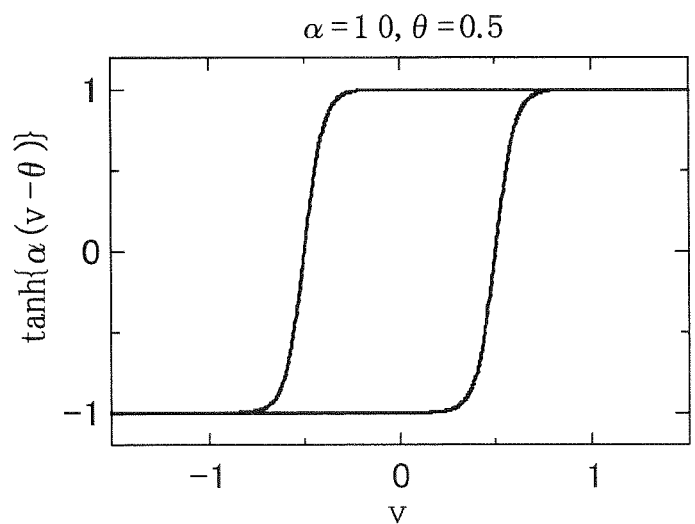
FIG. 7 shows a graph of Equation (3).

A Sigmoid function is a function which outputs "0" when $v_{mix}(t)$ is smaller than the threshold value θ and outputs "1" when $v_{mix}(t)$ is greater than the threshold value θ, and this function represents the operation of the comparator 202. FIG. 7 shows a graph of the Equation (3). In this graph, α=10, θ=±0.5. As shown in FIG. 7, this Sigmoid function has hysteresis. In other words, if v increases from the negative side and exceeds 0.5, the output of the Sigmoid function is 1. If v decreases from the positive side and becomes lower than −0.5, the output of the Sigmoid function is 0.

If the output $v_{out}(t)$ of the comparator 202 is rewritten by combining Equation (2) and Equation (3), then it can be expressed by Equation (4).

$$v_{out}(t)=\tan h[\alpha\{w \cdot v_{in}(t)+\eta(t)-\theta\}] \tag{4}$$

$v_{out}(t)$ is input to the differentiation circuit 203 in the following stage, as $v_{in2}$.

Figure 8A:
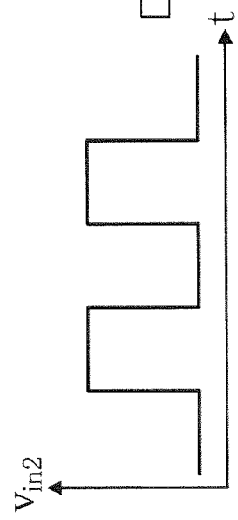
FIGS. 8A to 8C are illustrative diagrams of the operation of the differentiation circuit.
Figure 8B:
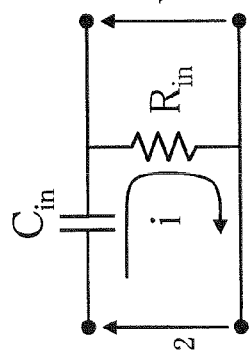
Figure 8C:
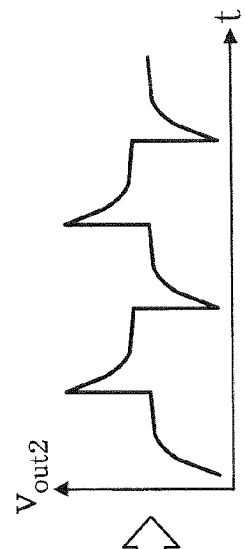

FIGS. 8A to 8C are illustrative diagrams of the operation of the differentiation circuit 203; wherein FIG. 8A is a waveform diagram of $v_{in2}$, FIG. 8B shows a differentiation circuit 203, and FIG. 8C is a waveform diagram of $v_{out2}$, which is the output from the differentiation circuit 203.

The output from the comparator 202, $v_{in2}$, is a square wave as shown in FIG. 8A. When $v_{in2}$ passes through the differentiation circuit 203, $v_{in2}$ is attenuated by the time constant (CR) of the differentiation circuit 203, and the signal $v_{out2}$ having a waveform such as that shown in FIG. 8C is output from the differentiation circuit 203. Here, $C_{in}=C$, and $R_{in}=R$.

The value i shown in FIG. 8B is expressed by the following equation.

$$i(t)=(v_{in2}/R)\cdot\exp(-t/CR)$$

Furthermore, $V_{out2}$ is expressed by the following equation.

$$v_{out2}=R\cdot i(t)$$

Therefore, from the two equations described above, the attenuation of the differentiation circuit 203 is expressed by Equation (5).

$$v_{out2}=v_{in2}(t)\cdot\exp(-t/CR) \quad (5)$$

Here, if the attenuation in Equation (5) approaches the saw tooth wave expressed in Equation (6), the Equation (7) is obtained and this forms the master equation of the stochastic resonators 20. The value $t_{saw}$ indicated below represents the attenuation time of the saw tooth wave. More specifically, taking the moment when the state of the comparator 202 switches from low level to high level (or from high level to low level) as 0, $t_{saw}$ represents the elapsed time until switching of the comparator occurs next.

$$x_{saw}(t_{saw}) = \frac{2}{\pi}\sum_{k=1}^{\infty}\frac{(-1)^{k-1}\sin(kt_{saw})}{k} \quad (6)$$

$$v_{out2} = \frac{dv_{in}}{dt} = \tanh[\alpha\{w\cdot v_{in}(t)+\eta(t)-\theta\}]\cdot\exp(-x_{saw}(t_{saw})/C_{in}R_{in}) \quad (7)$$

Figure 9:
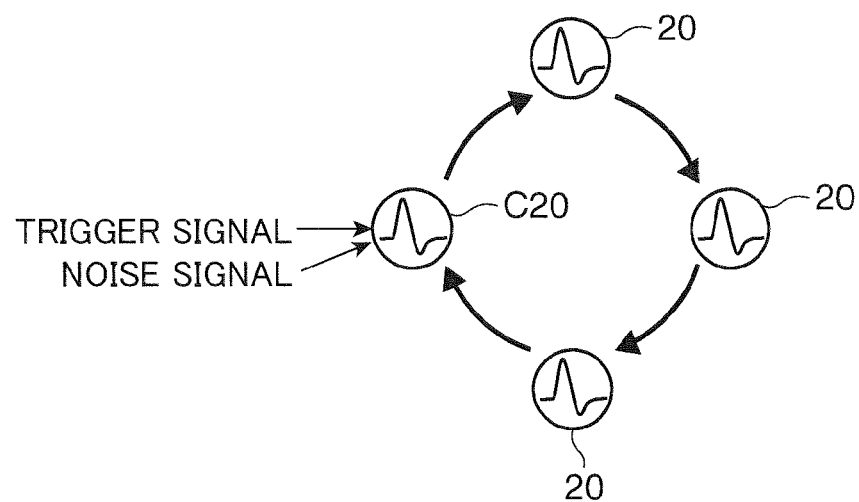
FIG. 9 is an illustrative diagram of a fluctuation oscillator.

Next, the fluctuation oscillator 10 comprising stochastic resonators 20 coupled in a ring-like form is described mathematically. FIG. 9 is an illustrative diagram of the fluctuation oscillator 10. Of the stochastic resonators 20 which make up the fluctuation oscillator 10, the stochastic resonator 20 under particular consideration here is taken as the stochastic resonator under consideration C20.

A ring feedback signal output from the stochastic resonator 20 of the previous stage is input to the stochastic resonator under consideration C20 in addition to a noise signal and a trigger signal forming a weak signal. The intensity of the ring feedback signal varies depending on the coupling constant of the stochastic resonator 20. Here, the coupling constant is defined as "the peak intensity of the ring feedback signal divided by the threshold value when the stochastic resonator 20 switches on". Therefore, if the coupling constant is equal to or greater than 1, then a ring feedback signal equal to or greater than the threshold value is input to the stochastic resonator under consideration C20.

In the stochastic resonator under consideration C20 shown in FIG. 9, the signals which can be considered as input signals are: a trigger signal input from an external source, a ring loop back signal and a noise signal. If another fluctuation oscillator 10 is connected, the output signal from the fluctuation oscillator 10 is also included in the input signal.

These input signals are added together by the mixer circuit 201 of the stochastic resonator under consideration C20 to form a signal $v_i$, and similarly to the Equation (2), if the signal $v_i$ is processed against a threshold value by the comparator 202, then the signal $v_i$ is expressed by the differential equation expressed by the Equation (8).

The value $v_i'$ shown in Equation (8) is the output signal from the comparator 202 of the stochastic resonator under consideration C20. Furthermore, $\theta_i$ shows the threshold value of the stochastic resonator under consideration C20.

Moreover, if the signal $v_i'$ is input to the differentiation circuit 203, then the Equation (9) is obtained.

$$\frac{dv_1'(t)}{dt} = f\left(\sum_{j=1}^{n}w_{ij}v_j(t)+\eta(t)-\theta_i, \alpha\right) \quad (8)$$

$$\frac{dv_1(t)}{dt} = \tanh\left[\alpha\left(\sum_{j=1}^{n}w_{ij}v_j(t)+\eta(t)-\theta_i\right)\right]\cdot\exp\left(-\frac{x_{saw}(t_{saw})}{CR}\right) \quad (9)$$

The value $v_i$ shown in Equation (9) is the output signal from the stochastic resonator under consideration C20, in other words, the signal after passing through the differentiation circuit 203.

Furthermore, $w_{ij}$ indicates the coupling constant between the respective nodes which input an input signal to the stochastic resonator under consideration C20, and the stochastic resonator under consideration C20. The suffix i of $w_{ij}$ indicates the stochastic resonator under consideration C20, j indicates the respective nodes which input an input signal to the stochastic resonator under consideration C20. n indicates the number of nodes which input an input signal to the stochastic resonator under consideration C20.

Figure 10:
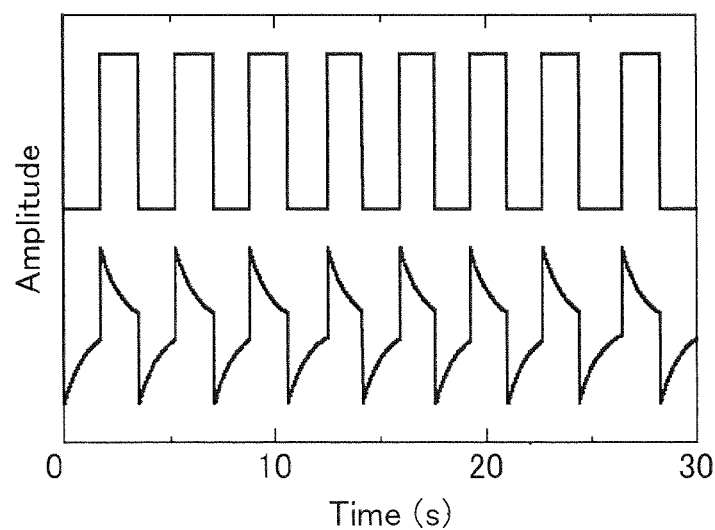
FIG. 10 is a graph showing simulation results of carrying out a simulation of the operation of a fluctuation oscillator using Equation (9).

Equation (9) is the master equation of the fluctuation oscillator 10. FIG. 10 is a graph showing the simulation results of a simulation of the operation of the fluctuation oscillator 10 using the Equation (9). This simulation uses the fluctuation oscillator 10 constituted by four stochastic resonators 20 coupled in a ring-like form as shown in FIG. 10, and white noise is added as a noise signal from an external source to the stochastic resonator under consideration C20 only. Moreover, the input signal and trigger signal from another fluctuation oscillator 10 are not input to the stochastic resonator under consideration C20. Furthermore, in the simulation, the values shown in FIG. 11 are applied to the various parameters in Equation (9).

In FIG. 10, the upper graph indicates the output signal from the comparator 202 of the stochastic resonator under consideration C20 and the lower graph indicates the output signal from the stochastic resonator under consideration C20.

As shown in the graph in FIG. 10, a signal which changes periodically is output from the stochastic resonator under consideration C20, and it can be confirmed that an oscillating phenomenon has occurred in the fluctuation oscillator 10.

The stochastic resonator 20 shown in FIG. 2 inputs the noise signal output from the noise generator 21 to the signal adder 22, but the composition is not limited to this and as indicated by the dotted line in FIG. 2, it is also possible to input the noise signal to the threshold value judgment unit 23 and to alter the threshold value of the threshold value judgment unit 23 in accordance with the noise signal. In this case, the signal added up by the signal adder 22 is compared with the threshold value, but since a fluctuation is applied to the threshold value in accordance with the noise signal, then it is possible to produce a stochastic resonance phenomenon, similarly to the composition in FIG. 2.

Figure 12:
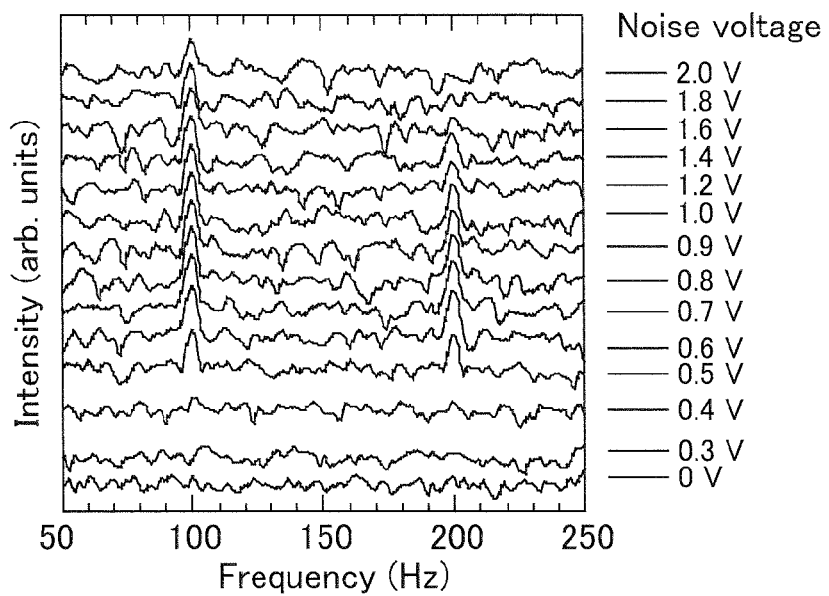
FIG. 12 is a graph showing the power spectrum of the output signal of a stochastic resonator when the intensity of the noise signal of the stochastic resonator shown in FIG. 2 is changed.

FIG. 12 is a graph showing the power spectrum of the output signal of the stochastic resonator 20 when the intensity of the noise signal in the stochastic resonator 20 shown in FIG. 2 is changed. This graph was measured by using a sinusoidal wave having a frequency of 100 Hz and amplitude of 70 mV as a sinusoidal wave, and using Gaussian white noise as a noise signal. Furthermore, the threshold value judgment unit 23 outputs a 1V pulse signal, sets a threshold value of 100 mV and a threshold value hysteresis width of approximately 50 mV.

The fourteen waveforms shown in FIG. 12 respectively show power spectra of the output signal of the stochastic resonator 20 when the intensity of the noise signal was 2.0V, 1.8V, 1.6V, 1.4V, 1.2V, 1.0V, 0.9V, 0.8V, 0.7V, 0.6V, 0.5V, 0.4V, 0.3V and 0V. As shown in FIG. 12, it can be seen that, as the intensity of the noise signal increases, the intensity of the output signal also increases. Furthermore, if the intensity of the noise signal is 0.5V to 2.0V, then a peak is observed in the vicinity of the frequency of 100 Hz.

Figure 13:
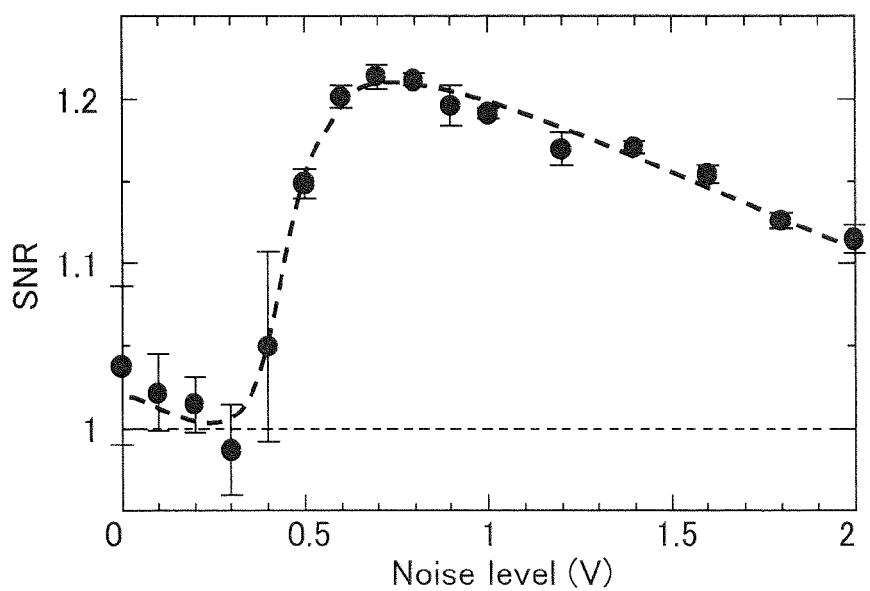
FIG. 13 is a graph showing the relationship between the S/N ratio of the output signal of the stochastic resonator shown in FIG. 2 and the intensity of the noise signal.

FIG. 13 is a graph showing the relationship between the S/N ratio of the output signal of the stochastic resonator 20 shown in FIG. 2 and the intensity of the noise signal, wherein the vertical axis represents the S/N ratio and the longitudinal axis represents the intensity of the noise signal. As shown in FIG. 13, it can be seen that this graph changes so as to trace a bell shape. Consequently, it is possible to adjust the S/N ratio by adjusting the intensity of the noise signal.

FIGS. 14A and 14B show waveform diagrams of the fluctuation oscillator 10 shown in FIG. 1. FIG. 14A shows a waveform diagram of a trigger signal, and FIG. 14B shows a waveform diagram of the signal output from the stochastic resonator 20-4. In FIGS. 14A and 14B, the threshold value of the respective stochastic resonators 20 is 100 mV, the noise signal is Gaussian white noise having an intensity of 300 mV, and the trigger signal has an amplitude of 500 mV and a coupling constant of 5.

Firstly, in the time period TM1, a trigger signal is input to the stochastic resonator 20-1, and a noise signal is also input. Here, a sinusoidal wave having a frequency of 1 Hz and an amplitude of 500 mV was used as a trigger signal. It can be seen that, when the trigger signal is input, as shown in FIG. 14B, a pulse signal is output from the respective stochastic resonators 20, so as to follow the trigger signal. It can be seen that, if the input of the trigger signal is cut off when the time period TM1 has passed, a pulse signal which has a pulse width some degree larger than the time period TM1 is output repeatedly at a constant period, and the fluctuation oscillator 10 oscillates. Therefore, it can be seen that, when the noise signal is cut off in the respective stochastic resonators 20, no pulse signal is output from the stochastic resonator 20-4 and the oscillation halts. In this way, according to the present fluctuation oscillator 10, if a trigger signal is input in a state where a noise signal is input to any one of the stochastic resonators 20, then a pulse signal having a constant period is output from the respective stochastic resonators 20, and even if the trigger signal is cut off, a pulse signal of virtually constant period is output from the respective stochastic resonators 20 and oscillation continues. Furthermore, it can be seen that, if the trigger signal is cut off, then in accordance with this, the pulse signal changes and the oscillation period changes autonomously and flexibly in accordance with the change in the input signal.

FIGS. 15A and 15B show waveform diagrams of signals output from the threshold value judgment units 23 of the stochastic resonators 20-2 and 20-4 in the fluctuation oscillator 10 shown in FIG. 1; FIG. 15A is a waveform diagram of a signal output from the threshold value judgment unit 23 of the stochastic resonator 20-2 and FIG. 15B is a waveform diagram of a signal output from the threshold value judgment unit 23 of the stochastic resonator 20-4. In FIG. 15, a noise signal is output at all times by the noise generator 21 in each of the stochastic resonators 20.

As shown in FIGS. 15A and 15B, it can be seen that pulse signals having virtually the same phase, frequency and amplitude are output from the threshold value judgment units 23 of the stochastic resonators 20-2 and 20-4. Therefore, it is clear that the same pulse signal is output from the threshold value judgment units 23 of the other stochastic resonators 20-1 and 20-3, each of the stochastic resonators 20 oscillates in the same way, and the same signal can be extracted from each stochastic resonator.

FIGS. 16A to 16D are waveform diagrams showing signals output when the intensity of the noise signal is changed in the fluctuation oscillator 10 shown in FIG. 1; FIGS. 16A to 16C show signals output from the stochastic resonator 20-4 when the intensity of the noise signal is 800 mV, 500 mV and 300 mV, and FIG. 16D shows a signal output from the stochastic resonator 20-4 when the intensity of the noise signal is initially 300 mV and then changes intermediately to 200 mV. Furthermore, in FIGS. 16A and 16B, a trigger signal is not input, and in FIGS. 16C and 16D, a trigger signal is input.

As shown in FIGS. 16A to 16D, it can be seen that as the intensity of the noise signal increases, the frequency of the output signal rises. Furthermore, if the intensity of the noise signal is changed from 300 mV to 200 mV, then oscillation does not halt immediately, but rather halts after a certain time. In this way, it can be seen that the oscillation frequency of the fluctuation oscillator 10 increases as the intensity of the noise signal becomes stronger, and the oscillation frequency decreases as the intensity of the noise signal becomes weaker; if the intensity of the noise signal becomes lower than a uniform value, then oscillation halts. It can also be seen that even if the intensity of the noise signal is changed to 200 mV which is the intensity at which oscillation halts, the fluctuation oscillator 10 does not halt oscillation immediately, but rather displays behavior similar to that of an actual CPG, which does not respond immediately to a change in input. Furthermore, if the intensity of the noise signal is stronger than a certain value (=500 mV), then the fluctuation oscillator 10 is able to oscillate autonomously, even if no trigger signal is input.

FIG. 17 is a graph showing the frequency dependence of the input/output cross-correlation function of the fluctuation oscillator 10 shown in FIG. 1. The vertical axis in FIG. 17 shows the absolute value of the cross-correlation value of the input/output signal, in other words, an indicator of the extent to which the output signal correlates to the input signal, and more specifically, shows the cross-correlation between the trigger signal and the output signal shown in FIGS. 18A to 18C and FIGS. 19A to 19C. The horizontal axis in FIG. 17 shows the frequency. As shown in FIG. 17, this graph changes so as to trace an upwardly convex curve with a peak at 1 Hz, and it is found that the resonant frequency of the fluctuation oscillator 10 is 1 Hz. Furthermore, it can be seen that the graph traces a slow curve in the vicinity of the peak and has slow properties.

Figures 18A, 18B, 18C:
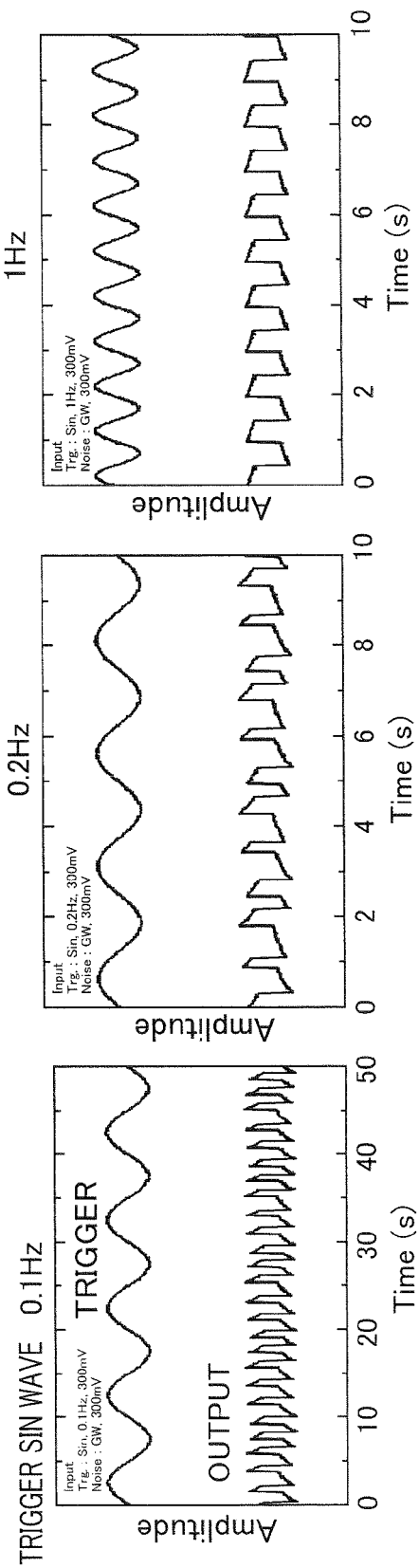
FIGS. 18A to 18C show waveform diagrams of a signal output from a fluctuation oscillator when the frequency of the trigger signal is changed in the fluctuation oscillator shown in FIG. 1.
Figure 19A:
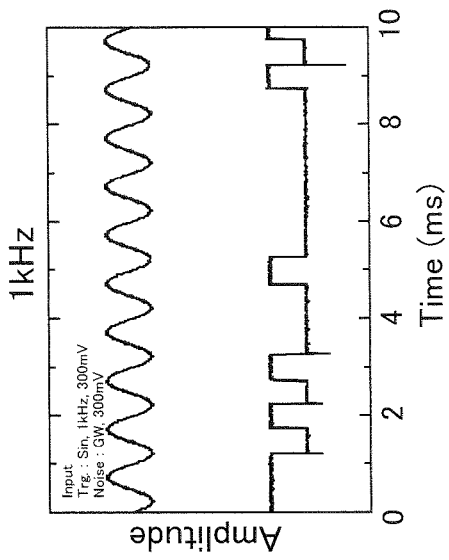
FIGS. 19A to 19C show waveform diagrams of a signal output from a fluctuation oscillator when the frequency of the trigger signal is changed in the fluctuation oscillator shown in FIG. 1.
Figure 19B:
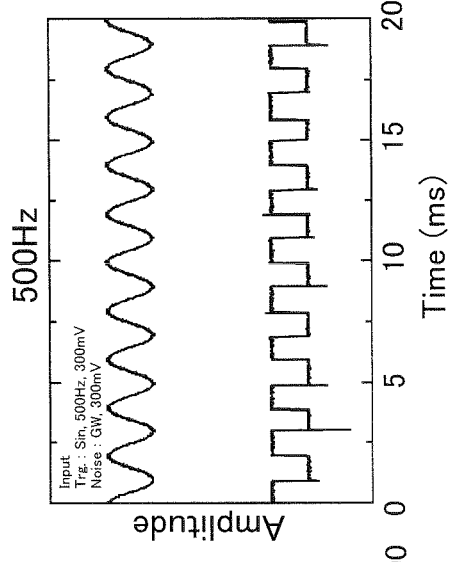
Figure 19C:
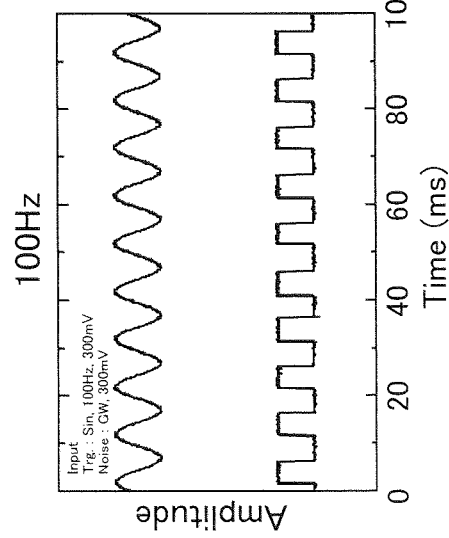

FIGS. 18A to 18C and FIGS. 19A to 19C show waveform diagrams of signals which are output from the fluctuation oscillator 10 shown in FIG. 1 when the frequency of the trigger signal is changed in the fluctuation oscillator 10; FIGS. 18A to 18C show waveform diagrams when the frequency of the trigger signal is 0.1 Hz, 0.2 Hz and 1 Hz, respectively, and FIGS. 19A to 19C show waveform diagrams when the frequency of the trigger signal is 100 Hz, 500 Hz and 1 kHz, respectively. In FIGS. 18A to 18C and FIGS. 19A to 19C, the upper curve represents the trigger signal and the lower curve represents the signal output from the fluctuation oscillator 10. Furthermore, in FIGS. 18A to 18C and FIGS. 19A to 19C, the trigger signal is a sinusoidal wave having an amplitude of 300 mV, and the noise signal is white Gaussian noise having an intensity of 300 mV.

As shown in FIG. 18C and FIGS. 19A and 19B, it can be seen that, when the frequency of the trigger signal is 1 Hz, 100 Hz and 500 Hz, then the frequency and the phase of the output signal from the fluctuation oscillator 10 and the trigger signal are almost the same, and the output signal is able to follow the trigger signal. As shown in FIGS. 18B and 18A, it can be seen that as the frequency of the trigger signal decreases to 0.2 Hz and 0.1 Hz, then the frequency of the output signal becomes larger than the frequency of the trigger signal, and the output signal is not able to follow the trigger signal. Furthermore, as shown in FIG. 19C, it can be seen that, if the frequency of the trigger signal is a high frequency of 1 kHz, then the pulses do not appear at a constant period and the fluctuation oscillator 10 cannot oscillate.

From these findings, it can be seen that the fluctuation oscillator 10 can oscillate so as to follow the trigger signal if the frequency of the trigger signal is within a uniform range, but if the frequency of the trigger signal is lower than a certain frequency, then the frequency of the output signal becomes greater than the frequency of the trigger signal, and the fluctuation oscillator 10 can no longer oscillate so as to follow the trigger signal. Furthermore, it can be seen that if the frequency of the trigger signal is greater than a certain frequency, then the fluctuation oscillator 10 can no longer oscillate.

Next, the fluctuation oscillating system according to the present embodiment of the present invention will be described. FIG. 20 is a diagram showing the composition of the present fluctuation oscillating system 100. The fluctuation oscillating system 100 shown in FIG. 20 comprises three fluctuation oscillators 10-1 to 10-3 which are coupled unidirectionally. The respective fluctuation oscillators 10 each comprises four stochastic resonators 20-1 to 20-4.

The output terminal of the stochastic resonator 20-3 of the fluctuation oscillator 10-1 is connected to the input terminal of the stochastic resonator 20-2 of the fluctuation oscillator 10-3, the output terminal of the stochastic resonator 20-3 of the fluctuation oscillator 10-2 is connected to the input terminal of the stochastic resonator 20-4 of the fluctuation oscillator 10-3, the output signal from the fluctuation oscillator 10-1 is transmitted to the fluctuation oscillator 10-3 and the output signal from the fluctuation oscillator 10-2 is transmitted to the fluctuation oscillator 10-3. Moreover, an output signal is extracted from the stochastic resonator 20-3 of the fluctuation oscillator 10-3.

Consequently, the fluctuation oscillator 10-3 outputs, as an output signal, a periodic signal which is affected by the output signal from the fluctuation oscillator 10-1 and the output signal from the fluctuation oscillator 10-2, and therefore the fluctuation oscillator 10-3 is able to oscillate on the basis of a principle similar to that of a CPG, which oscillates autonomously due to the output from one neuron affecting the output of another neuron; a CPG can be achieved more accurately by combining together a plurality of fluctuation oscillators 10 in a variety of coupling patterns.

FIGS. 21A to 21C show waveform diagrams of a signal output from the fluctuation oscillating system 100 shown in FIG. 20, when the noise signal intensity is 1.5 V and when a 50 Hz and 500 mV sinusoidal wave is input as a trigger signal to the stochastic resonator 20-1 of the fluctuation oscillator 10-1 in the fluctuation oscillating system 100. FIGS. 21A to 21C respectively show the output signal from the fluctuation oscillator 10-1 which is synchronized with a 50 Hz trigger signal, the output signal from the fluctuation oscillator 10-2 which oscillates on the basis of a noise input only, and the output signal from the fluctuation oscillator 10-3. As shown in FIGS. 21A to 21C, it can be seen that the output signal from the fluctuation oscillator 10-3 is a similar signal to the output signal from the fluctuation oscillator 10-1, and for a uniform time period after the output signal from the fluctuation oscillator 10-2 has fallen, a signal which has assumed a low level state is output due to the effects of the output signal from the fluctuation oscillator 10-2 which is in a low-level state. Consequently, it can be seen that a signal which oscillates in a new oscillation pattern that is affected by the output signal from the fluctuation oscillator 10-1 and the output signal from the fluctuation oscillator 10-2, and which inherits the characteristics of these signals, is output from the fluctuation oscillator 10-3.

In the fluctuation oscillating system 100, the number of fluctuation oscillators 10 is not limited to three, and may be two or four or more. In this case, it is possible to connect the fluctuation oscillators 10 in a branched configuration, in such a manner that one fluctuation oscillator 10 is connected to the stochastic resonator 20-2, for example, which constitutes the fluctuation oscillator 10-1 shown in FIG. 20, and another fluctuation oscillator 10 is connected to the stochastic resonator 20-4, for example, which constitutes the fluctuation oscillator 10-1. Furthermore, it is also possible to connect a plurality of serially connected fluctuation oscillators 10 to a fluctuation oscillator 10-3, in such a manner that one fluctuation oscillator 10 is connected to the stochastic resonator 20-1, for example, which constitutes the fluctuation oscillator 10-1 shown in FIG. 20, and another fluctuation oscillator 10 is connected to one stochastic resonator 20 which constitutes this one fluctuation oscillator 10. Moreover, it is also possible for another one fluctuation oscillator 10 to be connected to a stochastic resonator 20-1 of the fluctuation oscillator 10-3 shown in FIG. 20.

The number of stochastic resonators 20 constituting the respective fluctuation oscillators 10 is not limited to four, and the number may be two, three or five or more, and furthermore, the number of stochastic resonators 20 constituting each of the respective fluctuation oscillators 10 may be the same or mutually different.

Next, the observation device according to an embodiment of the present invention will be described. FIG. 22 is a diagram showing the composition of the observation device 200. As shown in FIG. 20, the observation device 200 comprises a fluctuation oscillator 10, a sensor 300 and a monitor apparatus 400. The sensor 300 is a sensor for determining environmental information, such as temperature and humidity. The monitor apparatus 400 is, for example, constituted by an oscilloscope, which is connected to the output terminal of the stochastic resonator 20-3 and monitors the output signal from the stochastic resonator 20-3.

In the observation device 200, when environmental information is determined by the sensor 300, this determination signal is input to the stochastic resonator 20-1 and therefore the oscillation frequency of the fluctuation oscillator 10 changes due to the effects of the determination signal. On the other hand, the monitoring apparatus 400 monitors the output signal from the stochastic resonator 20-3 and is therefore able to represent the change in the oscillation frequency and to determine very slight changes in the environmental information.

In the observation device 200 shown in FIG. 22, the number of fluctuation oscillators 10 is one, but the number is not limited to this, and a plurality of fluctuation oscillators 10 can be coupled unidirectionally as in the fluctuation oscillating system shown in FIG. 20. Furthermore, the number of stochastic resonators 20 constituting the fluctuation oscillator 10 is not limited to four, and may be two, three or five or more, and if a plurality of fluctuation oscillators 10 are used, then the number of stochastic resonators 20 which constitute each fluctuation oscillator 10 may be respectively the same or different.

Figure 23:
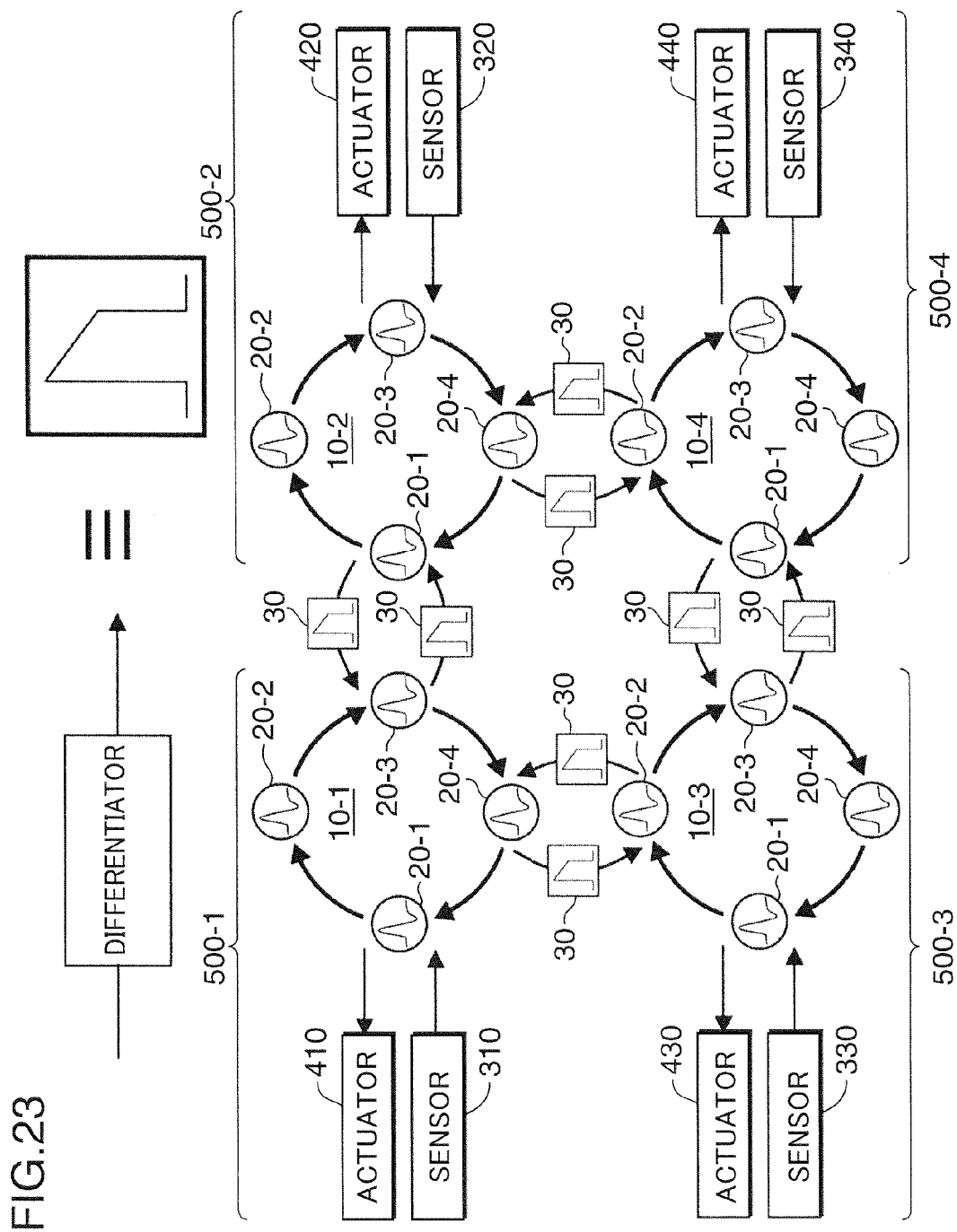
FIG. 23 is a diagram showing the composition of a control system.

Next, the control system according to an embodiment of the present invention is described. FIG. 23 is a diagram showing the composition of the control system. The control system comprises four control units 500-1 to 500-4 and eight differentiators 30. The control unit 500-1 comprises a fluctuation oscillator 10-1, a sensor 310 and an actuator 410.

The input terminal and the output terminal of the stochastic resonator 20-3 of the fluctuation oscillator 10-1 are respectively connected to the output terminal and input terminal of the stochastic resonator 20-1 of the fluctuation oscillator 10-2, via differentiators 30, 30, and the control units 500-1 and 500-2 are coupled bi-directionally. The input terminal and output terminal of the stochastic resonator 20-4 of the fluctuation oscillator 10-1 are respectively connected to the output terminal and the input terminal of the stochastic resonator 20-2 of the fluctuation oscillator 10-3 via differentiators 30, 30, and the control units 500-1 and 500-3 are coupled bidirectionally.

The input terminal and the output terminal of the stochastic resonator 20-3 of the fluctuation oscillator 10-3 are respectively connected to the output terminal and input terminal of the stochastic resonator 20-1 of the fluctuation oscillator 10-4 via differentiators 30, 30, and the control unit 500-3 and 500-4 are coupled bidirectionally. The input terminal and output terminal of the stochastic resonator 20-2 of the fluctuation oscillator 10-3 are respectively connected to the output terminal and the input terminal of the stochastic resonator 20-4 of the fluctuation oscillator 10-2 via differentiators 30, 30, and the control units 500-2 and 500-4 are coupled bidirectionally. In other words, the fluctuation oscillators 10-1 to 10-4 are coupled bidirectionally in a lattice configuration.

Consequently, the fluctuation oscillators 10-1 to 10-4 change oscillation frequency while mutually affecting each other, in such a manner that the output signal of the fluctuation oscillator 10-1 affects the output signal of the fluctuation oscillator 10-3 and the output signal of the fluctuation oscillator 10-3 affects the output signal of the fluctuation oscillator 10-1.

The fluctuation oscillator 10-1 is constituted by four stochastic resonators 20-1 to 20-4. The determination signal from the sensor 310 and the output signal of the stochastic resonator 20-4 are input to the stochastic resonator 20-1. The output terminal of the stochastic resonator 20-1 of the fluctuation oscillator 10-1 is connected to the actuator 410. The control units 500-2 to 500-4 have the same composition as the control unit 500-1 and hence description thereof is omitted here.

The sensor 310 determines the environmental information, such as the temperature and humidity, and the like, and the determination signal is output to the fluctuation oscillator 10-1. The actuator 410 operates the respective joints of a multiple-joint robot so as to reproduce the action of a lizard or the action of a snake, for example, in accordance with the output signal from the fluctuation oscillator 10-1. In the present embodiment, since the multiple-joint robot has a first to a fourth joint, then the actuators 410 to 440 respectively operate the first to fourth joints.

In the control system composed in this way, for example, if the environmental information determined by the sensor 310 changes, then in accordance with this, the oscillation frequency of the fluctuation oscillator 10-1 changes, and due to this change, the oscillation frequency of the fluctuation oscillators 10-2 to 10-3 changes, and the operation of the actuators 420 to 440 changes. Here, the fluctuation oscillators 10-1 to 10-4 operate on the basis of stochastic resonance as described above, and therefore by connecting these oscillators in a network, it is possible to cause the fluctuation oscillators 10-1 to 10-4 to oscillate as in an actual CPG, in addition to which the first to fourth joints can be operated so as to affect each other mutually, rather than operating completely independently. Therefore, the multiple-joint robot can be made to operate as an actual living organism, and the actions of a living organism can be reproduced in a realistic fashion.

In FIG. 23, the number of control units is four, but the number is not limited to this and it may also be two, three or five or more. In this case also, similarly to a case where there are four control units, the plurality of controls units should be coupled bi-directionally in a lattice configuration.

Next, a control system relating to a further embodiment of the present invention will be described. The control system according to this further embodiment is a control system which controls a snake-like robot that swims in water. This snake-like robot was developed by another researcher. The other researcher controlled this snake-like robot by generating a sinusoidal wave having a staggered phase using an existing computer and inputting the sinusoidal wave having a staggered phase to the respective segments of the snake-like robot.

On the other hand, the present inventor controls a snake-like robot by using the control system consisting of a fluctuation oscillator 10 as described below.

Figure 24:
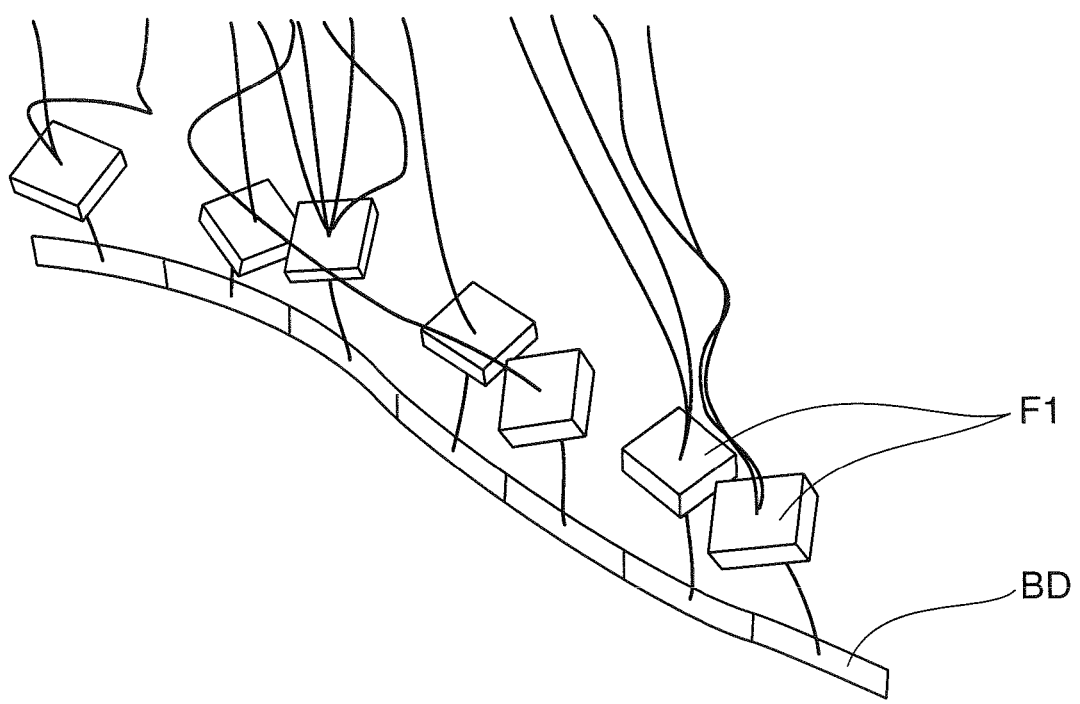
FIG. 24 is an external schematic drawing of a snake-like robot.

FIG. 24 shows an external schematic drawing of a snake-like robot. As shown in FIG. 24, the snake-like robot has a ribbon-like body portion BD. The body portion BD comprises a main body portion BD1 and electrodes formed so as to divide this body portion BD into a plurality of segments (for example, seven segments) on the front surface and rear surface of the main body portion BD1. Here, the main body portion BD1 is constituted by a member which bends when voltage is applied, and in the present embodiment, is constituted by an ion-conductive polymer (Ionic Polymer Metal Composite). Furthermore, seven floats F1 are attached via cords to the body portion BD so as to correspond to each of the segments. Since the floats F1 float on the surface of the water, the body portion BD is able to swim in the water while maintaining a uniform position from the surface of the water.

FIGS. 25A and 25B show cross-sectional diagrams of the body portion BD; FIG. 25A shows an off state and FIG. 25B shows an on state. As shown in FIGS. 25A and 25B, in the body portion BD, two reed-shaped electrodes P1, P2, for example, are formed so as to sandwich the main body portion BD1 therebetween. Here, the main body portion BD1 has a structure in which cations and water molecules are dispersed inside an ion conductive polymer gel. Gold, for example, is used for the electrodes P1, P2.

As shown in FIG. 25A, in an off state where a voltage is not applied between the electrodes P1 and P2, the cations and water molecules are present in an unbiased fashion, and therefore the body portion BD does not bend. On the other hand, as shown in FIG. 25B, if a voltage is applied between the electrodes P1 and P2 in such a manner that the electrode P1 becomes positive and the electrode P2 becomes negative, then the cations and the water molecules are drawn toward the side of the electrode P2. Consequently, the body portion BD bends toward the side of the electrode P1.

A plurality of electrodes P1 are arranged on the front surface of the main body portion BD1, and a plurality of electrodes P2 of the same size as the electrodes P1 are arranged on the rear surface of the main body portion BD1 so as to oppose the electrodes P1. Consequently, the body portion BD is divided up into a plurality of segments.

In FIG. 24, the body portion BD is divided into seven segments by arranging seven electrodes P1 on the front surface of the body portion BD and arranging seven electrodes P2 on the rear surface of the body portion BD.

Figure 26:
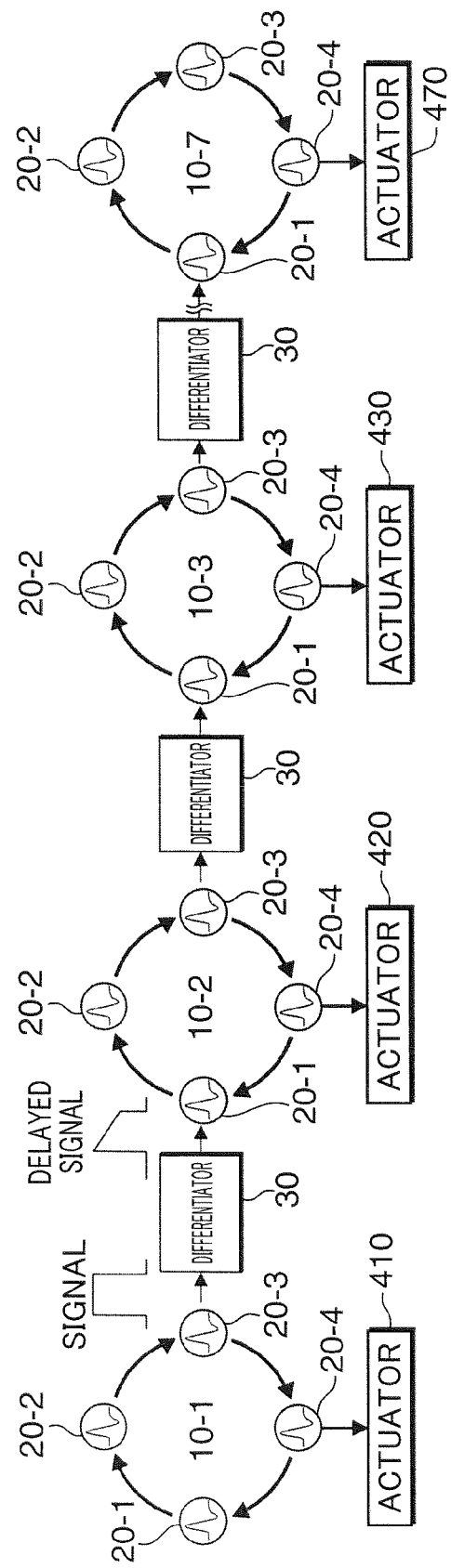
FIG. 26 is a diagram showing a control system according to a further embodiment of the present invention.

FIG. 26 is a diagram showing the control system according to a further embodiment of the present invention. The control system shown in FIG. 26 comprises seven fluctuation oscillators 10-1 to 10-7 which are provided so as to correspond to seven segments, and six differentiators 30 which are connected between the respective fluctuation oscillators 10-1 to 10-7. In other words, the control system comprises seven fluctuation oscillators 10-1 to 10-7 which are unidirectionally coupled via differentiators 30.

More specifically, fluctuation oscillators 10-1 to 10-7 are unidirectionally coupled in such a manner that the output terminal of the stochastic resonator 20-3 of the fluctuation oscillator 10-1 is connected to the input terminal of the stochastic resonator 20-1 of the fluctuation oscillator 10-2 via a differentiator 30.

In FIG. 26, the control system is constituted by seven fluctuation oscillators 10, but the number is not limited to this and the control system may also be constituted by a number of fluctuation oscillators 10 corresponding to the number of segments, be it two, three or five or more.

Figure 25:
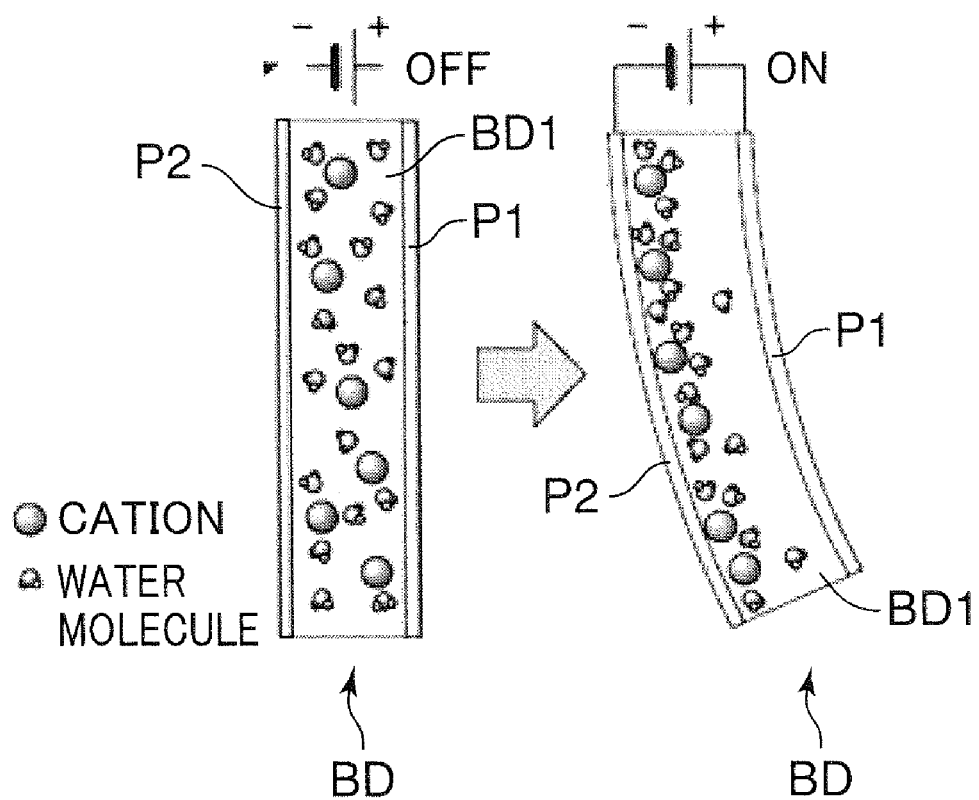
FIGS. 25A and 25B are cross-sectional diagrams of a body portion.

The actuators 410 to 470 respectively correspond to the segments of the body portion BD which is divided into seven segments as shown in FIG. 25. The electrode P1 of each of the actuators 410 to 470 is connected to the output terminal of the each of the stochastic resonators 20-4 which constitute the fluctuation oscillators 10-1 to 10-7, and the electrode P2 of each actuator is grounded. The actuators 410 to 470 operate the body portion BD according to the output signals from the fluctuation oscillators 10-1 to 10-7. The actuators 410 to 470 are not limited to being connected to the stochastic resonator 20-4 and may also be connected to the other stochastic resonators 20-1 to 20-3. Furthermore, it is also possible to connect two or more actuators 410 to one fluctuation oscillator 10, for example, in such a manner that the actuator 410 is connected to both the stochastic resonators 20-2 and 20-4.

The differentiators 30 are set to have a time constant greater than the differentiators 24 which form the stochastic resonators 20, and the signal which is circulated in the fluctuation oscillator 10 connected to the input side and the signal which is circulated in the fluctuation oscillator 10 connected to the output side can be set to have the same frequency and respectively staggered phases. In other words, the differentiation time of the differentiators 30 is longer than the differentiation time of the differentiators 24 constituting the stochastic resonators 20. Therefore, the signal which is circulated in the fluctuation oscillator 10 has a higher frequency than the signal which is output from the differentiator 30. Consequently, the phase of the signal circulated inside the fluctuation oscillator 10 which is connected to the output side of the differentiator 30 and the phase of the signal circulated inside the fluctuation oscillator 10 which is connected to the input side of the differentiator 30 are staggered.

Therefore, signals having staggered phases are input to the respective segments and the body portion BD can be made to move in a serpentine fashion, and hence the snake-like robot can be made to swim.

Figures 27A, 27B, 27C:
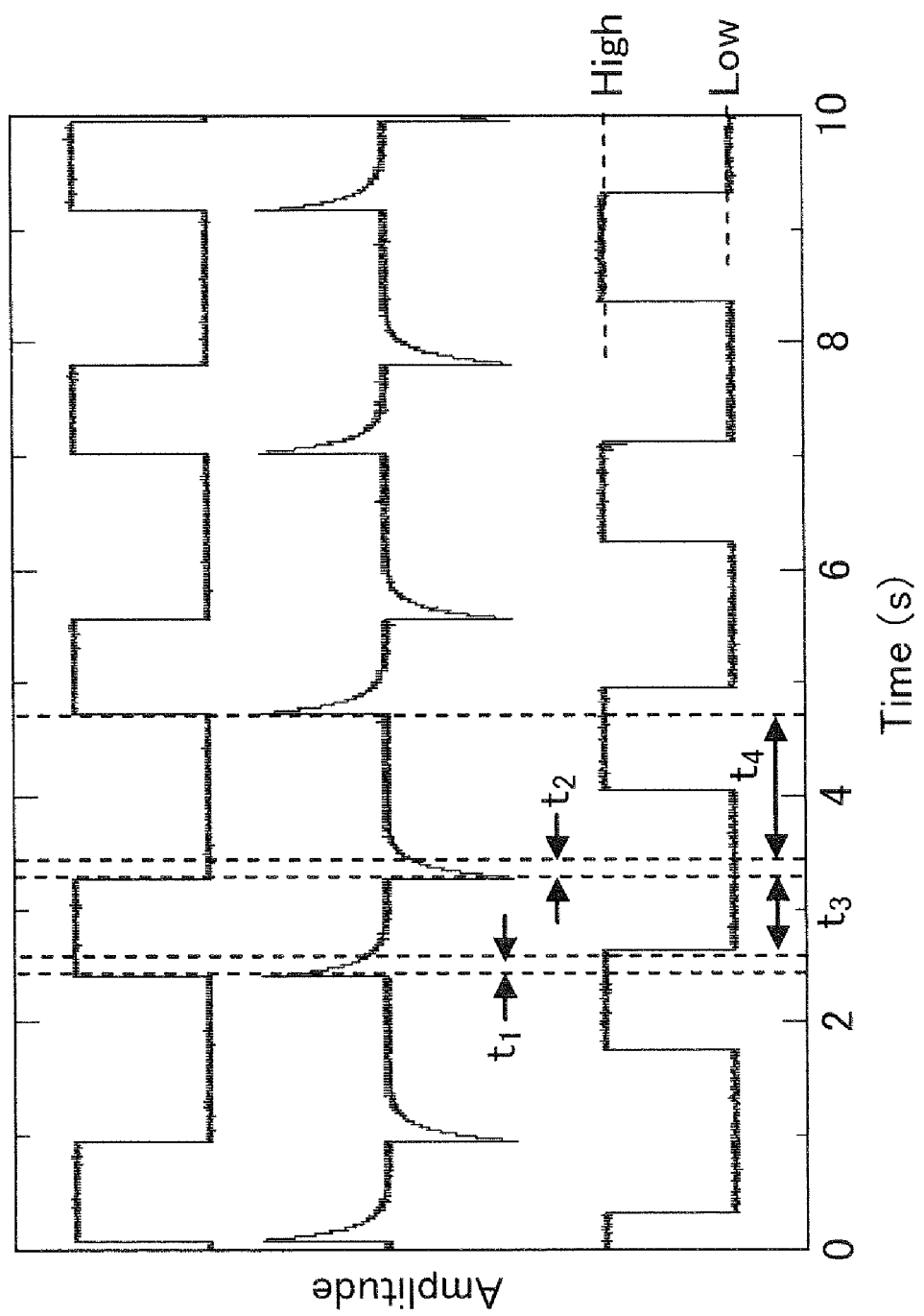
FIGS. 27A to 27C show waveform diagrams of a fluctuation oscillator constituting the control system shown in FIG. 26.

FIGS. 27A to 27C show waveform diagrams of the fluctuation oscillators 10-1 and 10-2 which form the control system shown in FIG. 26; FIG. 27A shows an output signal from the threshold value judgment unit 23 of the stochastic resonator 20-3 of the fluctuation oscillator 10-1; FIG. 27B shows an output signal from the differentiator 30; and FIG. 27C shows an output signal from the threshold value judgment unit 23 of the stochastic resonator 20-3 of the fluctuation oscillator 10-2.

As shown in FIGS. 27A to 27C, the output signal from the fluctuation oscillator 10-1 is differentiated by the differentiator 30, attenuated in accordance with the time constant of the differentiator 30 and input to the fluctuation oscillator 10-2. At the time t1 shown in FIG. 27B, upon receiving the output signal of the fluctuation oscillator 10-1, the fluctuation oscillator 10-2 changes to a high-level state in a cooperative fashion, but since the output signal of the fluctuation oscillator 10-1 is attenuated by the action of the differentiator 30, then at time t3, the fluctuation oscillator 10-2 oscillates freely again.

Similarly, at time t2 shown in FIG. 27B, the fluctuation oscillator 10-2 receives the output of the fluctuation oscillator 10-1 and assumes a low-level state, but at time t4, the fluctuation oscillator 10-2 oscillates freely again. Due to an action of this kind, the fluctuation oscillator 10-2 in the following stage is able to determine an oscillation timing freely while also being affected by the operation of the oscillator 10-1 in the previous stage, and this is the basis of the flexibility and cooperation of the fluctuation oscillator system consisting of the fluctuation oscillators 10-1 and 10-2. The duration of the time periods t1 and t2 is determined by the time constant of the differentiator 30. The fluctuation oscillators 10-2 and 10-3, and the fluctuation oscillators 10-3 and 10-4, also operate in a similar manner to the fluctuation oscillators 10-1 and 10-2, and therefore description thereof is omitted here.

FIGS. 28A to 28D show waveform diagrams of the signals output from the respective fluctuation oscillators 10-1 to 10-4 shown in FIG. 26 when the intensity of the noise signal is 1V, and more specifically, the output signals from the threshold value judgment units 23 of the respective stochastic resonators 20-3 which make up the fluctuation oscillators 10-1 to 10-4. As shown in FIG. 28, since the phases of the output signals (oscillation patterns) are staggered in each of the fluctuation oscillators 10, then it is possible to make the mutually adjacent actuators 410 operate in a chain-like sequence. Furthermore, irregular oscillation is observed in the portion indicated by the arrows in FIGS. 28A to 28D. This is because the fluctuation oscillator 10-4 of the following stage is synchronized with the output of the fluctuation oscillator 10-3 of the preceding stage, and it can be seen that the oscillation is adjusted autonomously in such a manner that the phase difference between the fluctuation oscillators 10-1 to 10-4 does not become too large.

Figure 29:
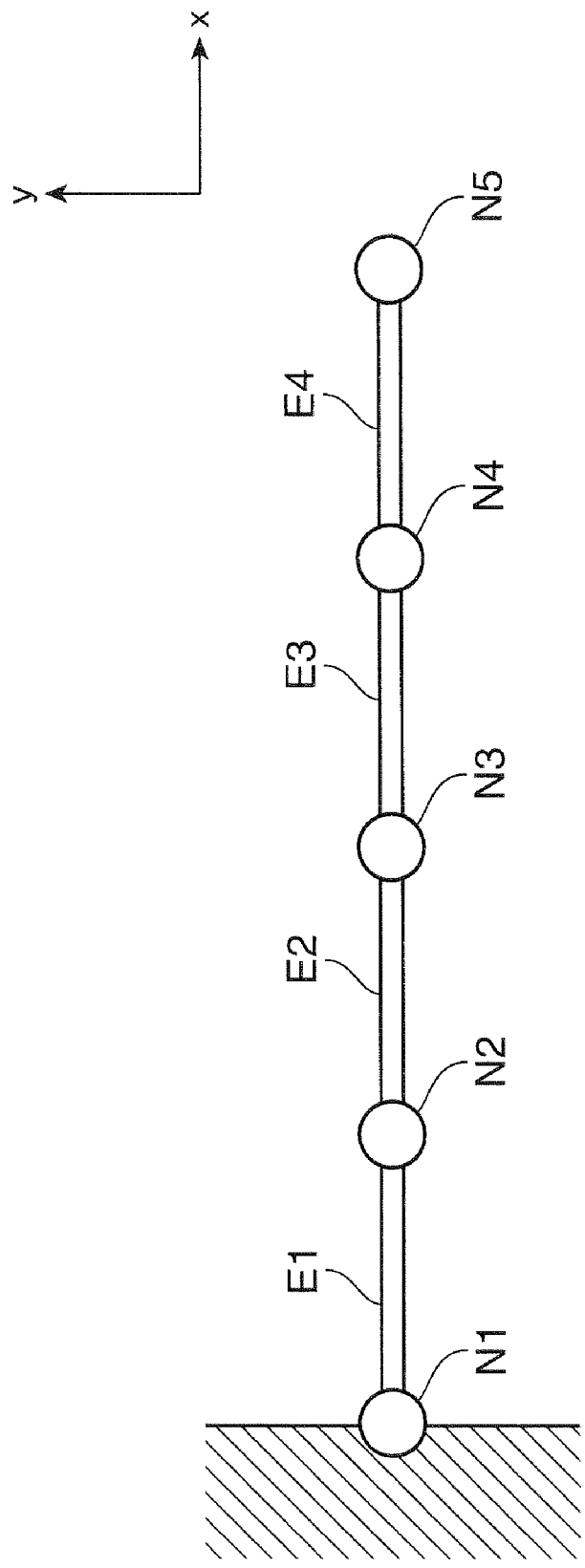
FIG. 29 is a diagram showing a simulation model of a snake-like robot used in a simulation.
Figure 30D:
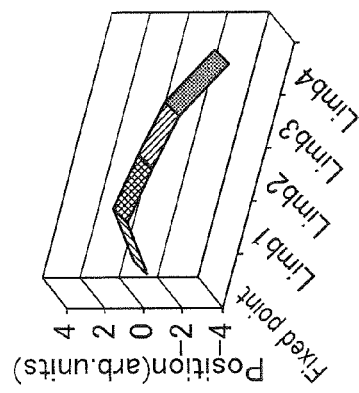
FIGS. 30A to 30D are graphs showing the movement of the simulation model shown in FIG. 29.
Figure 30C:
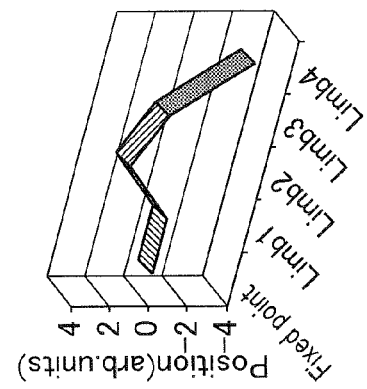
Figure 30B:
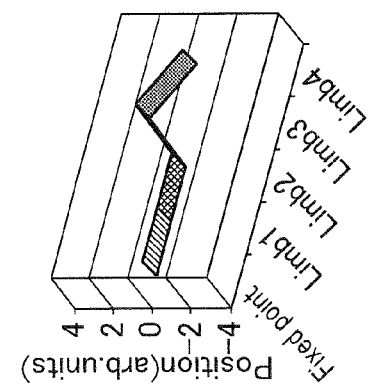
Figure 30A:
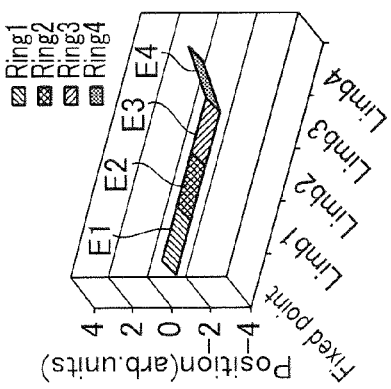

Next, a simulation carried out in order to confirm the operation of the control system shown in FIG. 26 will now be described. FIG. 29 is a diagram showing a simulation model of a snake-like robot which was used for the simulation. As shown in FIG. 29, the simulation model comprises five nodes N1 to N5 and four edges E1 to E4 which connect these nodes N1 to N5 together.

Node N1 is a fixed point. The nodes N2 to N5 are movable points which correspond to the actuators 410 to 440 shown in FIG. 26. The edges E1 to E4 rotate about the nodes N1 to N5 due to receiving virtual forces from the nodes N1 to N5. The x axis shown in FIG. 29 indicates the lengthwise direction of the edges E1 to E4 which are arranged in a single line before the application of the output signals from the fluctuation oscillators 10-1 to 10-4, and the y axis indicates the direction which is perpendicular to the x axis.

FIGS. 30A to 30D are graphs showing the action of a simulation model when the output signals from the fluctuation oscillators 10-1 to 10-4 constituting the control circuits shown in FIG. 26 were input to the simulation model shown in FIG. 29. FIGS. 29A to 29D respectively show the state of the simulation model at successive set time intervals after the start of application of the output signals from the fluctuation oscillators 10-1 to 10-4 to the simulation model. As shown in FIGS. 29A to 29D, it can be seen that the edges E1 to E4 move in a chain-like sequence.

In this way, according to the control system shown in FIG. 26, since the fluctuation oscillators 10-1 to 10-7 are coupled unidirectionally via differentiators 30, it is possible to stagger the phases of the fluctuation oscillators 10-1 to 10-7 without the phase difference between the oscillation patterns becoming excessively large, and the actuators 410 to 470 which are connected to the fluctuation oscillators 10-1 to 10-7 can be made to operate in a chain-like sequence, thus making the snake-line robot, which is a multiple-joint robot, move realistically like a snake or lizard.

In the embodiment described above, as shown in FIG. 1, a fluctuation oscillator 10 is constituted by coupling a plurality of stochastic resonators 20 unidirectionally in a ring-like form, but the composition is not limited to this, and a fluctuation oscillator 10 may also be constituted by a single stochastic resonator 20 as shown in FIG. 2. In this case, a feedback loop is formed between the output terminal and the input terminal 221 of the stochastic resonator 20, and the threshold value of the threshold value judgment unit 23 should be adjusted to a prescribed value so as to produce oscillation.

The characteristic technical features of the embodiment described above can be summarized as follows.

(1) The fluctuation oscillator described above comprises a plurality of stochastic resonators which apply fluctuation to an input signal by superimposing a noise signal thereon, compare the resulting signal with a threshold value and then perform differentiation to output a pulse signal, the plurality of stochastic resonators being coupled unidirectionally in a ring-like form in such a manner that an output terminal of one stochastic resonator is connected to an input terminal of the stochastic resonator of the following stage, and an input terminal of the one stochastic resonator is connected to an output terminal of the stochastic resonator of the preceding stage.

In this fluctuation oscillator, when a signal is input to one stochastic resonator, fluctuation is applied by adding a noise signal to the input signal, and after comparing with a threshold value, a differentiated signal is output. The output signal is input to a stochastic resonator which is connected on the downstream side, a noise signal is added again, the signal is compared with a threshold value and then differentiated and output. In other words, the signal output from each respective stochastic resonator is a stochastic signal output to the stochastic resonator connected on the downstream side.

When the signal output in this way is transmitted between stochastic resonators which are coupled in a ring-like form, due to the cooperation phenomenon between the stochastic resonators, the timings at which the respective stochastic resonators switch on are synchronized and each of the stochastic resonators is self-excited to oscillate at a constant period of time. In other words, since there is fluctuation in the timing at which the stochastic resonators switch on, the respective stochastic resonators oscillate by autonomously selecting a readily synchronizable timing. Therefore, it is possible to generate a periodic signal using a principle similar to a CPG, which is a generator based on a neural network constituted by a neuron that fires on the basis of a stochastic resonance, which sends out a periodic signal autonomously, and it is also possible to provide an oscillator which is useful in artificially realizing a CPG.

Furthermore, in the present fluctuation oscillator, the oscillation frequency is not determined by the time constant which is governed by the resistance or the capacitor, as in a conventional oscillator, and therefore it is possible to provide an oscillator which is able to change oscillation period flexibly and autonomously. Moreover, the present fluctuation oscillator is a noise driven-type oscillator which uses a noise signal as a drive source, and therefore it is possible to lower the drive voltage, and the like, of the semiconductor elements which make up the circuit, as well as being able to provide an oscillator which has low power consumption and is robust in respect of noise.

(2) Desirably, the stochastic resonators each comprises: a superimposition circuit for superimposing noise on an input signal; a comparison circuit for comparing the superimposition circuit with a threshold value; and a differentiator which differentiates a signal output from the comparison circuit.

In this case, the stochastic resonator can be constructed by means of a simple composition.

(3) Desirably, the stochastic resonators each further comprises an output unit for adjusting a coupling constant which indicates the extent to which one stochastic resonator is able to transmit a signal to an adjacent stochastic resonator.

In this case, the oscillation frequency of the output signal from the fluctuation oscillator can be adjusted by adjusting the coupling constant.

(4) Desirably, the oscillation frequency of the output signal from the fluctuation oscillator is changed by adjusting at least one of the intensity of the noise signal, the time constant of the differentiator and the coupling constant between the stochastic resonators.

According to this composition, it is possible to adjust the oscillation frequency of the output signal from the fluctuation oscillator to a desired frequency.

(5) Desirably, the stochastic resonators each further comprises a terminal to which a trigger signal forming a trigger that causes the respective stochastic resonators to oscillate is input.

In this case, since a terminal to which a trigger signal for causing the stochastic resonators to oscillate is input is provided, then it is possible to cause the stochastic resonators to oscillate more reliably by inputting a trigger signal.

(6) The fluctuation oscillating system described above comprises a first and a second fluctuation oscillator, each being constituted by the fluctuation oscillator as described above, an input terminal of one stochastic resonator which constitutes the first fluctuation oscillator being connected to an output terminal of one stochastic resonator which constitutes the second fluctuation oscillator.

In this fluctuation oscillating system, since the first and second fluctuation oscillators are connected in such a manner that the output signal of the first fluctuation oscillator is input to the second fluctuation oscillator, then it becomes possible to affect the output signal of the second fluctuation oscillator by means of the output signal of the first fluctuation oscillator, and it is possible to provide a more practicable oscillator which is close to a CPG.

(7) The observation device described above comprises: the fluctuation oscillator as described above; sensing means for determining environmental information and outputting a determination signal to the input terminal of one stochastic resonator constituting the fluctuation oscillator; and monitoring means for monitoring the output signal of the fluctuation oscillator.

In this observation device, when environmental information is determined by the sensing means, then a determination signal is input to one of the stochastic resonators which constitutes the fluctuation oscillator, and therefore the oscillation frequency of the fluctuation oscillator changes due to the effects of the determination signal. On the other hand, since the monitoring device monitors the output signal from the stochastic resonators, then it is able to represent the change in the oscillation frequency. In other words, since the environmental information is determined by using a stochastic resonator, it is possible to determine weak environmental information with good accuracy.

(8) The control system described above comprises a first and a second control unit comprising the fluctuation oscillator described above, and an actuator which is controlled by the output signal of the fluctuation oscillator; and a differentiator interposed between one stochastic resonator constituting the fluctuation oscillator in the first control unit and one stochastic resonator constituting the fluctuation oscillator in the second control unit.

In this control system, it is possible to provide a control system based on a completely new concept, which uses a fluctuation oscillator.

(9) Desirably, the first and second control units are coupled bidirectionally in such a manner that an input terminal and an output terminal of one stochastic resonator constituting the fluctuation oscillator in the first control unit are respectively connected, via a differentiator, to an output terminal and an input terminal of one stochastic resonator constituting the fluctuation oscillator in the second control unit.

In this case, it is possible to drive the actuator while mutually coordinating the first control unit and the second control unit.

(10) Desirably, the first and second control units are coupled unidirectionally in such a manner that an output terminal of one stochastic resonator constituting the fluctuation oscillator in the first control unit is connected to an input terminal of one stochastic resonator constituting the fluctuation oscillator in the second control unit.

In this case, since the fluctuation oscillator constituting the first control unit and the fluctuation oscillator constituting the second control unit are coupled unidirectionally via a differentiator, then it is possible to stagger the phases of the fluctuation oscillator constituting the first control unit and the fluctuation oscillator constituting the second control unit in such a manner that the phase difference in the oscillation patterns does not become excessively large, and hence the first and second actuators can be made to operate in a chain-like sequence.

(11) Desirably, the first and second control units each further comprises sensing means for determining environmental information and outputting a determination signal to the input terminal of one stochastic resonator constituting the fluctuation oscillator.

According to this composition, it is possible to provide a control system based on a completely new concept, wherein change in the environmental information due to the operation of an actuator is determined by the sensing means, and the outputs of the fluctuation oscillators which constitute the respective control units change and hence the operation of the other actuators changes, on the basis of this change in the environmental information.

The invention claimed is:

1. A fluctuation oscillator, comprising a plurality of stochastic resonators which apply fluctuation to an input signal by superimposing a noise signal thereon, compare the resulting signal with a threshold value, and then perform differentiation to output a pulse signal,
wherein the plurality of stochastic resonators are coupled unidirectionally in a ring-like form in such a manner that an output terminal of one stochastic resonator is connected to an input terminal of the stochastic resonator of the following stage, and an input terminal of the one stochastic resonator is connected to an output terminal of the stochastic resonator of the preceding stage.

2. The fluctuation oscillator according to claim 1, wherein the stochastic resonators each comprises:
a superimposition circuit for superimposing noise on an input signal;
a comparison circuit for comparing a signal output from the superimposition circuit with a threshold value; and
a differentiator which differentiates a signal output from the comparison circuit.

3. The fluctuation oscillator according to claim 2, wherein the stochastic resonators each further comprises n output unit for adjusting a coupling constant which indicates the extent to which one stochastic resonator is able to transmit a signal to an adjacent stochastic resonator.

4. The fluctuation oscillator according to claim 3, wherein the oscillation frequency of the output signal from the fluctuation oscillator is changed by adjusting at least one of the intensity of the noise signal, the time constant of the differentiator and the coupling constant between the stochastic resonators.

5. The fluctuation oscillator according to claim 1, wherein the stochastic resonators each further comprises a terminal to which a trigger signal forming a trigger that causes the respective stochastic resonators to oscillate is input.

6. A fluctuation oscillating system, comprising a first and a second fluctuation oscillator, each being constituted by the fluctuation oscillator according to claim 1,
wherein an input terminal of one stochastic resonator constituting the first fluctuation oscillator is connected to an output terminal of one stochastic resonator constituting the second fluctuation oscillator.

7. An observation device, comprising:
a fluctuation oscillator with a plurality of stochastic resonators that apply fluctuation to an input signal by superimposing a noise signal thereon, compare the resulting signal with a threshold value, and then perform differentiation to output a pulse signal;
sensing means for determining environmental information and outputting a determination signal to the input terminal of one stochastic resonator constituting the fluctuation oscillator; and
monitoring means for monitoring the output signal of the fluctuation oscillator;
wherein the plurality of stochastic resonators are coupled unidirectionally in a ring-like form in such a manner that an output terminal of one stochastic resonator is connected to an input terminal of the stochastic resonator of the following stage, and an input terminal of the one stochastic resonator is connected to an output terminal of the stochastic resonator of the preceding stage.

8. A control system, comprising:
a first and a second control unit comprising a fluctuation oscillator with a plurality of stochastic resonators that apply fluctuation to an input signal by superimposing a noise signal thereon, compare the resulting signal with a threshold value, and then perform differentiation to output a pulse signal, and an actuator which is controlled by the output signal of the fluctuation oscillator; and
a differentiator interposed between one stochastic resonator constituting the fluctuation oscillator in the first control unit and one stochastic resonator constituting the fluctuation oscillator in the second control unit wherein the plurality of stochastic resonators are coupled unidirectionally in a ring-like form in such a manner that an output terminal of one stochastic resonator is connected to an input terminal of the stochastic resonator of the following stage, and an input terminal of the one stochastic resonator is connected to an output terminal of the stochastic resonator of the preceding stage.

9. The control system according to claim 8, wherein the first and second control units are coupled bidirectionally in such a manner that an input terminal and an output terminal of one stochastic resonator constituting the fluctuation oscillator in the first control unit are respectively connected, via a differentiator, to an output terminal and an input terminal of one stochastic resonator constituting the fluctuation oscillator in the second control unit.

10. The control system according to claim 8, wherein the first and second control units are coupled unidirectionally in such a manner that an output terminal of one stochastic resonator constituting the fluctuation oscillator in the first control unit is connected to an input terminal of one stochastic resonator constituting the fluctuation oscillator in the second control unit.

11. The control system according to claim 8, wherein the first and second control units each further comprises sensing means for determining environmental information and outputting a determination signal to the input terminal of one stochastic resonator constituting the fluctuation oscillator.

* * * * *